(12) United States Patent
Futter et al.

(10) Patent No.: US 12,243,715 B2
(45) Date of Patent: Mar. 4, 2025

(54) ION BEAM SPUTTERING APPARATUS AND METHOD

(71) Applicant: Institute of Geological and Nuclear Sciences Limited, Lower Hutt (NZ)

(72) Inventors: Richard John Futter, Lower Hutt (NZ); Ryan James Davidson, Lower Hutt (NZ); Jerome Leveneur, Lower Hutt (NZ); John Vedamuthu Kennedy, Lower Hutt (NZ)

(73) Assignee: Institute of Geological and Nuclear Sciences Limited, Lower Hutt (NZ)

( * ) Notice: Subject to any disclaimer, the term of this patent is extended or adjusted under 35 U.S.C. 154(b) by 429 days.

(21) Appl. No.: 16/956,419

(22) PCT Filed: Dec. 21, 2018

(86) PCT No.: PCT/NZ2018/050183
§ 371 (c)(1),
(2) Date: Jun. 19, 2020

(87) PCT Pub. No.: WO2019/125186
PCT Pub. Date: Jun. 27, 2019

(65) Prior Publication Data
US 2021/0104380 A1 Apr. 8, 2021

(30) Foreign Application Priority Data
Dec. 22, 2017 (NZ) .................................. 738705

(51) Int. Cl.
*H01J 37/317* (2006.01)
*C23C 14/22* (2006.01)
(Continued)

(52) U.S. Cl.
CPC ........ *H01J 37/3178* (2013.01); *C23C 14/221* (2013.01); *C23C 14/3407* (2013.01);
(Continued)

(58) Field of Classification Search
CPC .......... H01J 37/3178; H01J 2237/3146; H01J 37/30; H01J 37/317; C23C 14/221;
(Continued)

(56) References Cited

U.S. PATENT DOCUMENTS 3,895,602 A * 7/1975 Bobenrieth ............. C23C 14/46
219/121.33
4,747,922 A 5/1988 Sharp
(Continued)

FOREIGN PATENT DOCUMENTS

CN 1033297 A 6/1989
CN 1636076 A 7/2005
(Continued)

OTHER PUBLICATIONS

JPH0625844A Translation (Year: 1994).*
(Continued)

*Primary Examiner* — James Lin
*Assistant Examiner* — Patrick S Ott
(74) *Attorney, Agent, or Firm* — Fox Rothschild LLP; Carol E. Thorstad-Forsyth

(57) ABSTRACT

An aspect of the invention provides an ion beam sputtering apparatus comprising an ion source configured to generate a hollow ion beam along a beam axis that is located in a hollow part of the beam; and a sputtering target having a target body that defines at least one target surface, the target body comprising sputterable particles, the target body being located relative to the ion source so that the ion beam hits the at least one target surface to sputter particles from the target body towards a surface of an object to be modified. The target body is shaped so that the particles sputtered towards a surface to be modified are generally sputtered from the sputtering target in radially extending sputter directions relative to the beam axis, the sputter directions being one of
(Continued)

(i) directions extending towards the beam axis and (ii) directions extending away from the beam axis.

40 Claims, 12 Drawing Sheets

(51) Int. Cl.
*C23C 14/34* (2006.01)
*C23C 14/46* (2006.01)
*C23C 14/56* (2006.01)

(52) U.S. Cl.
CPC ............ *C23C 14/46* (2013.01); *C23C 14/562* (2013.01); *H01J 2237/3146* (2013.01)

(58) Field of Classification Search
CPC ... C23C 14/3407; C23C 14/46; C23C 14/562; C23C 14/14; C23C 14/04
See application file for complete search history.

(56) References Cited

U.S. PATENT DOCUMENTS

| | | | |
|---|---|---|---|
| 6,002,208 A * | 12/1999 | Ritter | H01J 27/143 250/492.23 |
| 6,130,507 A | 10/2000 | Maishev et al. | |
| 6,153,067 A * | 11/2000 | Maishev | H01J 37/08 204/298.12 |
| 6,171,721 B1 | 1/2001 | Narayanan et al. | |
| 6,214,183 B1 | 4/2001 | Maishev et al. | |
| 6,238,526 B1 * | 5/2001 | Maishev | H01J 37/3178 204/298.18 |
| 2007/0087578 A1 | 4/2007 | Sugiyama et al. | |
| 2008/0257263 A1 * | 10/2008 | Pavloff | H01J 37/3441 118/723 R |
| 2009/0071818 A1 | 3/2009 | Fukumiya et al. | |
| 2009/0226735 A1 | 9/2009 | Nadaud et al. | |
| 2010/0155225 A1 * | 6/2010 | Oishi | C23C 14/568 204/192.12 |
| 2014/0027274 A1 | 1/2014 | Godet et al. | |
| 2015/0090898 A1 | 4/2015 | Futter et al. | |
| 2016/0348232 A1 | 12/2016 | Chao | |
| 2017/0352540 A1 * | 12/2017 | Watanabe | H01L 29/66969 |

FOREIGN PATENT DOCUMENTS

| | | |
|---|---|---|
| EP | 0853330 A2 | 7/1998 |
| EP | 1371746 A1 | 12/2003 |
| JP | H0625844 A * | 2/1994 |
| JP | 2003/013221 A | 1/2003 |
| JP | 2005/248255 A | 9/2005 |
| WO | 2009/083193 A2 | 7/2009 |

OTHER PUBLICATIONS

International Search Report issued in PCT/NZ2018/050183 dated Jun. 27, 2019.
Gullá et al., "Toward Improving the Performance of PEM Fuel Cell by Using Mix Metal Electrodes Prepared by Dual IBAD," Journal of The Electrochemical Society, 153(2), pp. A366-A371 (2006).
Ramaswamy et al., "Enhanced activity and interfacial durability study of ultra low Pt based electrocatalysts prepared by ion beam assisted deposition (IBAD) method," Electrochimica Acta, 54, pp. 6756-6766 (2009).
Strong et al., "Depositing Catalyst Layers in Polymer Electrolyte Membrane Fuel Cells: A Review," Journal of Fuel Cell Science and Technology, vol. 12, 11 pages (Dec. 2015).
Wolf and Zucholl, "Ion Implanted Catalysts for Fuel Cell Reactions," Nuclear Instruments and Methods, 209/210, pp. 835-840 (1983).

* cited by examiner

ION BEAM SPUTTERING APPARATUS AND METHOD

CROSS REFERENCE TO RELATED APPLICATIONS

The present application is a U.S. National Phase of International Patent Application No. PCT/NZ2018/050183, filed Dec. 21, 2018, which claims the benefit and priority of New Zealand Patent Application No. 738703 which was filed on Dec. 22, 2017. The entirety of these applications are incorporated herein by reference.

FIELD

This present disclosure relates to ion beam sputtering apparatus and methods for sputtering particles onto surfaces.

More particularly, but not exclusively, the present disclosure relates to ion beam sputtering apparatus and methods for sputtering particles onto planar surfaces.

The present disclosure also relates to ion beam sputtering apparatus and methods for sputtering particles onto inner and/or outer conduit surfaces.

BACKGROUND

Ion beam surface modification (IBSM) technologies, such as ion beam sputtering, are used to deposit thin films of material onto surfaces. IBSM technologies have several practical advantages over other existing surface modification technologies.

IBSM metallisation, for example, among other things does not require prior surface preparation as the energy of the deposited atoms is high enough to break chemical bonds on the surface. Similar to other physical deposition techniques, it facilitates patterning with a resolution that is currently only bettered by post-processing with laser techniques and complex multi-step photo lithography techniques. As it is however a process that minimises temperature raise on the coated substrate and it is a line of sight technique, it allows the use of thin organic materials stencils.

A typical conventional sputtering system comprises an ion or deposition source, a sputtering target (or source), and a support arranged to support a substrate or other object having a surface to be modified or coated relative to the ion source and the sputtering target. The ion source, sputtering target and support are arranged in a vacuum chamber containing an inert gas, such as argon. The ion source is configured to generate a plasma, and strip high energy, positively charged ions from the plasma. The ions bombard the sputtering target, 'sputtering off' or ejecting atomic size particles from the sputtering target. The sputtered particles are directed towards and deposited on the surface to be modified.

In a conventional system, the ion source typically provides a point ion beam that is directed towards a generally planar surface of the sputtering target. The angle of incidence of the ion beam (being the angle between the ion beam and a line perpendicular to the surface of the sputtering target at the point of incidence between the ion beam and the surface) is typically greater than or equal to 45 degrees. That is, the glancing angle of the ion beam (being the angle between the ion beam and the surface of the sputtering target at the point of incidence) is typically less than or equal to 45 degrees. The sputtered particles (or atoms or molecules) are ejected from the surface over a range of angles. A majority of the sputtered particles, however, are typically ejected from the surface of the sputtering target in directions that are close to perpendicular to the ion beam. Further, a majority of the sputtered particles follow a substantially linear trajectory because of the low pressure in the vacuum chamber. Accordingly, in a conventional system the ion source, the sputtering target and the surface to be modified normally need to be aligned in a non-linear arrangement within the chamber, with the ion source the sputtering target and the source generally aligned perpendicularly to one another. In practice, a relatively large vacuum chamber is often required to house the ion source, the sputtering target and the surface to be modified.

Thus far, IBSM has been unsuitable for processing relatively large area surfaces, such as relatively large area, planar surfaces. IBSM has typically been constrained to batch processing in high vacuum environments in which a carousel can be used to move, for example rotate, surfaces to be modified in front of the sputter source within the vacuum environment. Further, apart from the microelectronics industry, IBSM has been limited to laboratory applications because IBSM currently requires a relatively large, complex vacuum equipment and is incompatible with industrial requirements (low cost and high throughput). Industrial polymer surface processes, for example, are typically required to operate on relatively large areas and with large throughput.

Many existing IBSM techniques are unsuitable and/or impractical for coating an inside or outside of conduits, such as pipes, tubes or barrels. To coat such cylindrical shapes, physical deposition techniques, and IBSM in particular, require rotating either source or sample or having multiple sources surrounding the sample or in the circumference of the sample.

For example, some configurations of ion beam sputtering may allow coating simultaneously a first side of ring shaped objects but still require samples to be flipped over to coat a second side. Furthermore, as these configurations use a full beam, they have the potential to be very power inefficient—the part of the ion beam hitting the protective cap over the ring is not contributing to the sputtering yield.

One of the problems with existing IBSM technologies is caused by the geometry of the sputtering. A significant amount of sputtered materials is usually deposited on the walls and other parts of the vacuum chamber rather than on the sample. This has the potential to lead to waste of sputtering materials and lower yield.

It is an object of at least preferred embodiments of the present invention to address at least some of the aforementioned disadvantages. An additional or alternative object is to at least provide the public with a useful choice.

SUMMARY

In accordance with an aspect of the invention, an ion beam sputtering apparatus comprises an ion source configured to generate a hollow ion beam along a beam axis that is located in a hollow part of the beam; and a sputtering target having a target body that defines at least one target surface, the target body comprising sputterable particles, the target body being located relative to the ion source so that the ion beam hits the at least one target surface to sputter particles from the target body towards a surface of an object to be modified. The target body is shaped so that the particles sputtered towards a surface to be modified are generally sputtered from the sputtering target in radially extending sputter directions relative to the beam axis, the sputter directions being one of (i) directions extending towards the beam axis and (ii) directions extending away from the beam axis.

The term 'comprising' as used in this specification means 'consisting at least in part of'. When interpreting each statement in this specification that includes the term 'comprising', features other than that or those prefaced by the term may also be present. Related terms such as 'comprise' and 'comprises' are to be interpreted in the same manner.

In an embodiment the target body has a target passage that extends through the target body, the target passage having an ion beam inlet for the ion beam and a particle outlet for sputtered particles to exit the target passage towards a surface to be modified, and the at least one target surface is in the form of at least one surface of the target body that at least partly defines the passage.

In an embodiment a cross sectional area of the ion beam inlet, in a plane perpendicular to the beam axis, is substantially larger than a cross sectional area circumscribed by an external periphery of the ion beam so that the beam can pass through the inlet.

In an embodiment, the sputter directions are directions extending towards the beam axis.

In an embodiment, the target passage is shaped to inhibit the ion beam exiting the target passage through the particle outlet towards (or reaching) a surface to be modified outside the passage without hitting the target surface.

In an embodiment, a cross sectional area of the particle outlet, in a plane perpendicular to the beam axis, is substantially smaller than a cross sectional area of a hollow portion of the ion beam.

In an embodiment, the beam axis intersects the ion beam inlet, the target passage and the particle outlet. In an embodiment, the beam axis is a central beam axis, and the target passage has a central passage axis that is substantially coaxial with the beam axis. In an embodiment, the target passage is generally symmetrical about the central passage axis and/or the beam axis. In an embodiment, the target body is also generally symmetrical about the central passage axis and/or the beam axis.

In an embodiment, at least part of the target passage intermediate the ion beam inlet and the particle outlet tapers towards the particle outlet.

In an embodiment, the target passage tapers from at or near the ion beam inlet to at or near the particle outlet. In an embodiment, the passage tapers at a substantially constant rate. In an embodiment, the target passage has a substantially frustoconical (or truncated-cone) shape.

In an embodiment, a cross sectional shape of the ion beam inlet (in a plane perpendicular to the beam axis) is substantially a circle. Alternatively, a cross sectional shape of the ion beam inlet may be other shapes, for example, substantially an oval, or a rectangle having rounded corners. In an embodiment, a cross sectional shape of the particle outlet (in a plane perpendicular to the beam axis) is substantially a circle. Alternatively, a cross sectional shape of the particle outlet may be other shapes, for example, substantially an oval, or a rectangle having rounded corners.

In an embodiment, the ion beam inlet is a circle substantially centred on the passage axis and/or the beam axis. In an embodiment, the particle outlet is a circle substantially centred on the passage axis and/or the beam axis. In an embodiment, the ion beam inlet and the particle outlet are substantially centred on the passage axis and/or the beam axis.

In an embodiment, the ion beam sputtering apparatus comprises a stencil at or near the particle outlet that defines a pattern for depositing the sputtered particles on to a surface to be modified according to the pattern. In an embodiment, the stencil is located adjacent, and at least partly extends across, the particle outlet.

In an embodiment, the sputtering target comprises one or more vacuum vents or openings that each extend through the target body. In an embodiment, the or each vent extends through the target body from a first end or part of the target body at or near the ion beam inlet to a second end or part of the target body at or near the particle outlet.

In an embodiment, the sputtering apparatus comprises or is associated with a support for at least partly supporting an object having a surface to be modified adjacent the particle outlet of the sputtering target, outside the passage.

In an embodiment, the ion source and the sputtering target are moveable relative to an object having a surface to be modified, that is located adjacent the particle outlet, outside the passage, in a direction that is substantially perpendicular to the beam axis.

In accordance with a further aspect of the invention a method of sputtering particles onto a surface comprises locating the surface adjacent the particle outlet of a sputtering apparatus, outside the target passage; creating at least a partial vacuum within a vacuum chamber that is at least partly defined by a housing that is associated with and/or part of the sputtering apparatus; generating (or providing) a hollow ion beam with the ion source; and directing the ion beam into the target passage via the ion beam inlet to sputter particles onto the surface.

In an embodiment, the surface is a planar surface, for example, a planar surface of a substrate.

In an embodiment, the method comprises moving (or advancing) the surface to be modified relative to the particle outlet.

In an embodiment, the method comprises moving the surface to be modified relative to the particle outlet in a direction that is substantially perpendicular to the beam axis.

Disclosed herein is a target body that defines a sputtering chamber for modifying a surface of an object to be modified that is located within the sputtering chamber with the sputtered particles, the target body has an ion beam inlet (or opening or mouth) for the ion beam, the ion beam inlet opening into the sputtering chamber, and the at least one target surface is in the form of (or provided by) at least one chamber (or inner) surface of the target body that at least partly defines the chamber.

In an embodiment, a cross sectional area of the ion beam inlet (in a plane perpendicular to the beam axis) is substantially larger than a cross sectional area circumscribed by an external periphery of the ion beam so that the beam can pass through the inlet.

In an embodiment, the sputtering chamber is shaped so that the particles sputtered towards an object having a surface to be modified are generally sputtered towards a central region within the sputtering chamber.

In an embodiment, the sputtering target comprises one or more shields (or guards), the or each shield being arranged to inhibit the ion beam hitting (or reaching) an object having a surface to be modified within the sputtering chamber. In an embodiment, the one or more shields comprises one or more radially and circumferentially extending (with reference to the beam axis) shields. The or each shield, in use, would be located upstream (with reference to the ion beam) of an object at least partly located within sputtering chamber.

In an embodiment, the beam axis intersects the ion beam inlet and the sputtering chamber. In an embodiment, the beam axis is a central beam axis, and the sputtering chamber has a central chamber axis that is substantially coaxial with the beam axis. In an embodiment, the sputtering chamber is generally symmetrical about the central chamber axis and/or the beam axis. In an embodiment, the target body is generally symmetrical about the central chamber axis and/or the beam axis.

In an embodiment, at least part of the sputtering chamber intermediate the ion beam inlet and an end part (or base) of the sputtering chamber that is downstream (with reference to the ion beam) of the ion beam inlet tapers in a direction towards the end part. In an embodiment, the sputtering chamber tapers from at or near the ion beam inlet to at or near the end part. In an embodiment, the passage tapers at a substantially constant rate. In an embodiment, the sputtering chamber has a substantially conical shape, and/or a substantially frustoconical shape intermediate the ion beam inlet and the end part.

In an embodiment, a cross sectional shape of the ion beam inlet (in a plane perpendicular to the beam axis) is substantially a circle (or ring). Alternatively, a cross sectional shape of the ion beam inlet may be other shapes, for example, substantially an oval, or a rectangle having rounded corners.

In an embodiment, the sputtering apparatus comprises or is associated with a support feature for at least partly supporting (or holding or suspending) an object having a surface to be modified within the sputtering chamber. For example, an object may extend through apertures (or openings) in the target body so that the object at least partly extends across and within the sputtering chamber.

In an embodiment, the ion source and the sputtering chamber are moveable relative to an object having a surface to be modified in a direction that is substantially perpendicular to the beam axis. For example, the object may be fed through the sputtering chamber in a direction that is perpendicular to the beam axis.

In an embodiment, the ion source and the sputtering target are rotatable relative to a surface to be modified within the sputtering chamber about an axis that is perpendicular to the beam axis. For example, an object comprising the surface may be rotated.

In accordance with a further aspect of the invention, a method of sputtering particles onto a surface comprises locating the surface within the sputtering chamber of a sputtering apparatus so that the surface at least partly extends across the sputtering chamber; creating at least a partial vacuum within a vacuum chamber that is at least partly defined by a housing that is associated with and/or part of the sputtering apparatus; generating (or providing) a hollow ion beam with the ion source; and directing the hollow ion beam into the sputtering chamber via the ion beam inlet to sputter particles onto the surface.

In an embodiment, the surface is an arcuate surface. In an embodiment, the surface is the outer surface of a conduit, for example, a pipe or tube. Alternatively, the surface may be a planar surface.

In an embodiment, the method comprises moving (or advancing) the surface to be modified relative to the ion beam and/or the sputtering chamber.

In an embodiment, the method comprises moving the surface to be modified relative to the ion beam and/or the sputtering chamber in a direction that is substantially perpendicular to the beam axis.

In an embodiment, the method comprises rotating the surface to be modified relative to the sputtering chamber.

In an embodiment, the sputter directions are directions extending away from the beam axis.

In an embodiment, the target body has at least one outer, peripheral surface that defines the at least one target surface.

In an embodiment, a cross sectional area of at least part of the target body increases in a direction away from the ion source so that the hollow ion beam strikes the at least one target surface.

In an embodiment, a cross sectional area circumscribed by an external periphery of at least part the target body (in a plane perpendicular to the beam axis) increases in a direction of the beam axis in a direction away from the ion source.

In an embodiment, the cross sectional area of at least part of the target body increases in a direction away from the ion source from a first cross sectional area that is substantially smaller than a cross sectional area of a hollow portion of the hollow ion beam to a second cross sectional area that is substantially larger than a cross sectional area of an external periphery of the hollow ion beam.

In an embodiment, the cross sectional area circumscribed by an external periphery of the target body increases from at or near a first end of the target body proximal to the ion source to at or near a second end of the target body distal the ion source, and downstream of the first end with reference to the ion beam.

In an embodiment, the cross sectional area of the external periphery of the target body increases at a substantially constant rate in the direction of the hollow ion beam.

In an embodiment, at least part of the periphery of the target body intermediate the first end and the second end has a substantially conical shape, or a substantially frustoconical shape.

In an embodiment, the sputtering apparatus is configured to at least partly extend within a hollow object (such as a conduit, or a tube or pipe), such that the beam axis is generally aligned with (parallel to or coaxial with) a central (or longitudinal) axis of the conduit.

In an embodiment, the sputtering target is moveable relative to an object having a surface to be modified in a direction that is substantially parallel to the beam axis.

In an embodiment, at least the sputtering target is moveable within a hollow object having an inner surface to be modified in a direction that is substantially parallel to the beam axis.

In accordance with a further aspect of the invention, a method of sputtering particles onto an inner surface of a conduit comprises locating a sputtering apparatus so that sputtering target is at least partly located within the conduit; creating at least a partial vacuum within a vacuum chamber that is at least partly defined by a housing that is associated with and/or part of the sputtering apparatus; generating (or providing) a hollow ion beam with the ion source; and directing the hollow ion beam onto the target surface of the sputtering target to sputter particles onto the inner surface.

In an embodiment, the surface is an arcuate surface. In an embodiment, the conduit is a pipe or tube.

In an embodiment, the method comprises moving (or advancing) the surface to be modified relative to the sputtering target. In an embodiment, the method comprises moving the surface to be modified relative to the sputtering target in a direction that is substantially parallel to the beam axis.

In an embodiment, a cross sectional shape of the ion beam, in a plane perpendicular to the beam axis, is substantially a hollow circle or ring. The cross-section circumscribed by the external periphery of the ion beam is a circle. Alternatively, a cross sectional shape of the ion beam may be other shapes, for example, substantially a hollow oval, or a hollow rectangle having rounded corners.

In an embodiment, the ion beam has a potential or accelerating energy greater than or equal to 500 V. In an embodiment, the ion beam has a potential or accelerating energy in the range of about 1 kV to about 30 kV. In an embodiment, the ion beam has a potential or accelerating energy in the range of about 15 kV to about 25 kV.

In an embodiment, an angle (or angles) of incidence of the ion beam is greater than or equal to about 45 degrees. That is, the glancing angle of the ion beam (being the angle between the ion beam and the surface of the sputtering target at the point of incidence) is less than or equal to about 45 degrees. In an embodiment, the angle of incidence is in the range of about 50 to about 80 degrees (glancing angle of the ion beam is in the range of about 10 to about 40 degrees). In an embodiment, the angle of incidence is in the range of about 60 to about 75 degrees. In an embodiment, the angle of incidence is in the range of about 65 to about 75 degrees. In an embodiment, the angle of incidence is about 70 degrees In an embodiment, the sputtering apparatus comprises, or is associated with, a housing that at least partly defines a vacuum chamber for the ion source and the sputtering target.

In an embodiment, the sputtering target is a unitary part. Alternatively, the sputtering target may be formed by two or more parts coupled and/or arranged together.

In an embodiment, the ion source is coupled to a heat sink to cool the ion source. In an embodiment, the heat sink comprises or is one or more copper parts or bodies.

In an embodiment, the target passage is shaped to inhibit the ion beam exiting the target passage through the particle outlet towards a surface to be modified outside the passage without hitting the target surface.

In an embodiment, the beam axis intersects the ion beam inlet, the target passage and the particle outlet.

In an embodiment, the beam axis is a central beam axis, and the target passage has a central passage axis that is substantially coaxial with the beam axis.

In an embodiment, the target passage is generally symmetrical about the central passage axis and/or the beam axis.

In an embodiment, the target body is also generally symmetrical about the central passage axis and/or the beam axis.

In an embodiment, the ion beam inlet and the particle outlet are substantially centred on the passage axis and/or the beam axis.

In an embodiment, a cross sectional shape of the ion beam inlet, in a plane perpendicular to the beam axis, is selected from a group comprising substantially circular, oval, and rectangular having rounded corners.

In an embodiment, a cross sectional shape of the particle outlet, in a plane perpendicular to the beam axis, is selected from a group comprising substantially circular, oval, and rectangular having rounded corners.

In an embodiment, the apparatus further comprises a stencil at or near the particle outlet that defines a pattern for depositing the sputtered particles on to a surface to be modified according to the pattern.

In an embodiment, the stencil is located adjacent, and at least partly extends across, the particle outlet.

In an embodiment, the sputtering target comprises one or more vacuum vents or openings that each extend through the target body.

In an embodiment, the or each vent extends through the target body from a first end or part of the target body at or near the ion beam inlet to a second end or part of the target body at or near the particle outlet.

In an embodiment, the apparatus comprises or is associated with a support for at least partly supporting an object having a surface to be modified adjacent the particle outlet of the sputtering target, outside the passage.

In an embodiment, the ion source and the sputtering target are moveable relative to an object having a surface to be modified, that is located adjacent the particle outlet, outside the passage, in a direction that is substantially perpendicular to the beam axis.

In an embodiment, the hollow ion beam has a width W and an inner radius R at the ion source and exhibits an increase in beam width as the hollow ion beam travels toward to sputtering target, the increase in beam width comprising:

an increase of the beam width of A away from the beam axis; and an increase of the beam width of B toward the beam axis.

In an embodiment, the sputtering target has a height d defined by $d=(A+W+B)\tan\delta$, wherein $\delta$ represents a slope of the sputtering target with respect to the hollow ion beam.

In an embodiment, the sputtering target has a maximum inner radius r equal to an inner radius $R-B$ of the hollow ion beam as it hits the sputtering target, the maximum inner radius defined by $a \leq r \leq R-B$.

In an embodiment, the sputtering target has a minimum height h defined by $h \geq d$.

In an embodiment, the sputtering target has a minimum width w defined by $w \geq A+W+B$.

In an embodiment, the sputtering target comprises a single material so that the at least one target surface provides the sputterable particles.

In an embodiment, the sputtering target comprises at least a first material and a second material, the first material different to the second material.

In an embodiment, the first material and the second material are positioned at substantially the same angle of incidence with respect to the hollow ion beam.

In an embodiment, the first material is positioned at a first angle of incidence with respect to the hollow ion beam and the second material is positioned at a second angle of incidence with respect to the hollow ion beam, the first angle of incidence different to the second angle of incidence.

In accordance with a further aspect of the invention, a method of sputtering particles onto a surface to be modified, the method comprises locating a sputtering target adjacent the particle outlet of a sputtering apparatus, the sputtering target having a target body defining at least one target surface; creating at least a partial vacuum within a vacuum chamber that is at least partly defined by a housing that is associated with and/or part of the sputtering apparatus; generating a hollow ion beam with the ion source of the sputtering apparatus; and directing the hollow ion beam into the target passage via the ion beam inlet so that the hollow ion beam hits the at least one target surface to sputter particles onto the surface to be modified. The target body is shaped so that the particles sputtered towards a surface to be modified are generally sputtered from the sputtering target in radially extending sputter directions relative to the beam axis, the sputter directions being one of (i) directions extending towards the beam axis and (ii) directions extending away from the beam axis.

In an embodiment, the ion beam is inhibited from exiting the target passage through the particle outlet towards the surface to be modified.

In an embodiment, the sputtering target comprises a single material so that the at least one target surface provides the sputterable particles.

In an embodiment, the sputtering target comprises at least a first material and a second material, the first material different to the second material.

In an embodiment, the method further comprises locating a stencil at or near the particle outlet that defines a pattern for depositing the sputtered particles on to a surface to be modified according to the pattern.

The invention in one aspect comprises several steps. The relation of one or more of such steps with respect to each of the others, the apparatus embodying features of construction, and combinations of elements and arrangement of parts that are adapted to affect such steps, are all exemplified in the following detailed disclosure.

To those skilled in the art to which the invention relates, many changes in construction and widely differing embodiments and applications of the invention will suggest themselves without departing from the scope of the invention as defined in the appended claims. The disclosures and the descriptions herein are purely illustrative and are not intended to be in any sense limiting. Where specific integers are mentioned herein which have known equivalents in the art to which this invention relates, such known equivalents are deemed to be incorporated herein as if individually set forth.

In addition, where features or aspects of the invention are described in terms of Markush groups, those persons skilled in the art will appreciate that the invention is also thereby described in terms of any individual member or subgroup of members of the Markush group.

As used herein the term '(s)' following a noun means the plural and/or singular form of that noun.

As used herein the term 'and/or' means 'and' or 'or', or where the context allows both.

It is intended that reference to a range of numbers disclosed herein (for example, 1 to 10) also incorporates reference to all rational numbers within that range (for example, 1, 1.1, 2, 3, 3.9, 4, 5, 6, 6.5, 7, 8, 9 and 10) and also any range of rational numbers within that range (for example, 2 to 8, 1.5 to 5.5 and 3.1 to 4.7) and, therefore, all sub-ranges of all ranges expressly disclosed herein are hereby expressly disclosed. These are only examples of what is specifically intended and all possible combinations of numerical values between the lowest value and the highest value enumerated are to be considered to be expressly stated in this application in a similar manner.

The qualifiers 'upper', 'lower', 'top', 'base, 'underside', 'topside', 'above', and 'below', and the like, and 'horizontal' and 'vertical', and the like, when used herein with reference to features as shown in the accompanying figures are for convenience and clarity of explanation, and are not to be construed as limiting the described sputtering apparatus, or the operation or use of the sputtering apparatus, and/or its components, to any particular orientation, including, but not limited to, any orientation described herein and/or depicted in the accompanying figures.

In this specification where reference has been made to patent specifications, other external documents, or other sources of information, this is generally for the purpose of providing a context for discussing the features of the invention. Unless specifically stated otherwise, reference to such external documents or such sources of information is not to be construed as an admission that such documents or such sources of information, in any jurisdiction, are prior art or form part of the common general knowledge in the art.

In the description in this specification reference may be made to subject matter which is not within the scope of the appended claims. That subject matter should be readily identifiable by a person skilled in the art and may assist in putting into practice the invention as defined in the presently appended claims.

Although the present invention is broadly as defined above, those persons skilled in the art will appreciate that the invention is not limited thereto and that the invention also includes embodiments of which the following description gives examples.

BRIEF DESCRIPTION OF THE DRAWINGS

Embodiments of the present disclosure will now be described, by way of non-limiting example only, and with reference to the accompanying drawings in which:

FIG. 10A shows a schematic top view of the sputtering target of sputtering apparatus according to a second embodiment of the present disclosure being used to sputter particles onto a surface of an object that is at least partly suspended in a sputtering chamber within the sputtering target;

FIG. 10B shows a cross sectional side view of the sputtering target of FIG. 10A, sectioned in the plane A-B in FIG. 10A;

DETAILED DESCRIPTION

Sputtering Apparatus (FIGS. 1-9)

Figure 1:
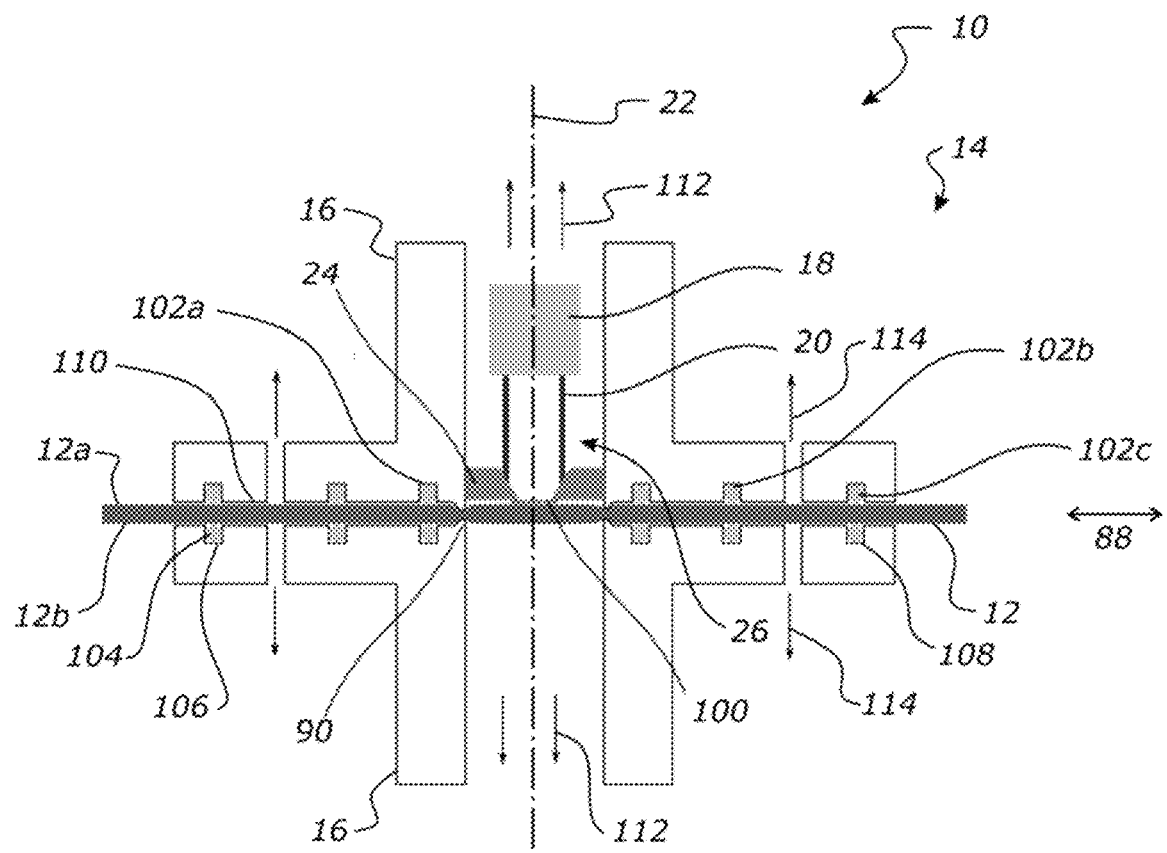
FIG. 1 shows a schematic cross sectional view of an ion beam deposition system having ion beam sputtering apparatus according to a first embodiment of the present disclosure.

An ion beam deposition system 10 suitable for depositing at least one material on a substantially planar surface (or area) 12a is shown schematically in FIGS. 1-9. The deposition system 10 comprises ion beam sputtering apparatus (or sputtering device) 14 according to a first embodiment of the present disclosure.

The sputtering apparatus 14 comprises or is associated with a housing 16, a high energy ion or deposition source 18 for generating or providing a high energy ion beam 20 along a beam axis 22, and a sputtering target 24 comprising sputterable particles. The housing 16 at least partly defines a vacuum chamber 26 for the ion source 18 and the sputtering target 24 that are both located and retained in the housing 16. The source 18 is operated under a vacuum. As will be described below, the source 18 is located relative to the sputtering target 24 so that the ion beam 20 hits, or strikes or bombards, the sputtering target 24 to sputter or eject atomic size particles, or atoms or molecules, from the sputtering target 24 towards a surface 12a to be modified.

An example ion source 18 is shown in FIGS. 3a-3f. The major components of the ion source 18 are each generally circular- or annular-shaped about the beam axis 22 and share a common axial centreline that is coaxial with the beam axis 22. The major components of the ion source 18 are a cathode 28, an anode 30, and a magnet 32. The cathode 28 is provided or formed by a front piece 28a, a body piece 28b and a back piece 28c. The ion source 18 also comprises insulators 34 for the anode voltage that extend through the generally circular cathode back piece 28c to the anode 30, an insulator 36 for a gas feed, and an insulator or barrier 38 between the cathode back piece 28c and the anode 30. The generally circular cathode front piece 28a is mounted to an end of the magnet 32. The magnet 32 may comprise or be made up of one or more magnet(s), such as one or more permanent magnet(s). In another embodiment, the magnet comprises one or more electromagnet(s).

In an embodiment, the ion source 18 has a ring shaped opening 40 for generating a thin, hollow ion beam. Examples of a hollow ion beam are indicated at 20 in FIGS. 8, 9, 10B, 10C, and 11.

In an embodiment, an ion beam is a stream of ions of similar charges propagating along an electric field gradient. A hollow ion beam is an ion beam that is generally cylindrical in shape. It presents a circular section with low to no ions streaming through a centre of the cylinder and a maximum number of ions flowing through a wall of the cylinder. Hollow ion beams are further described below with reference to FIG. 12.

The opening 40 has a cross sectional shape (in a plane perpendicular to the beam axis 22) that is substantially a hollow circle (or ring) shape so that the cross section of the resulting ion beam 20 is a hollow circle. The external diameter of the cathode body piece 28b may be about 23 mm, and the interior diameter of the cathode front piece 28a may be about 17 mm, so that the width of opening 40 (and the corresponding thickness or width 220 of the ion beam 20) is about 3 mm. The beam axis 22 is located in a hollow part of the ion beam. The beam axis is a central beam axis that intersects a centre of the hollow part of the ion beam. Circumferentially extending ends 42, 44 of the cathode front piece 28a and the cathode body piece 28b at least partly define the opening 40 and are each bevelled, for example, to define an angle 47 of about 45 degrees with the beam axis 22 at the opening 40.

Alternatively, the ion source 18 may have other shaped openings for generating or providing other shaped ion beams.

Figure 4:
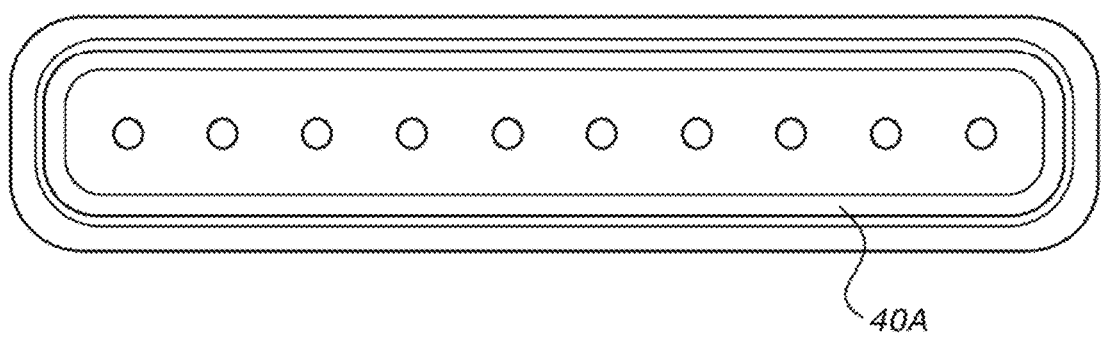
FIG. 4 shows a bottom side view of an ion source having a generally rectangular opening having straight square ends.
Figure 5:
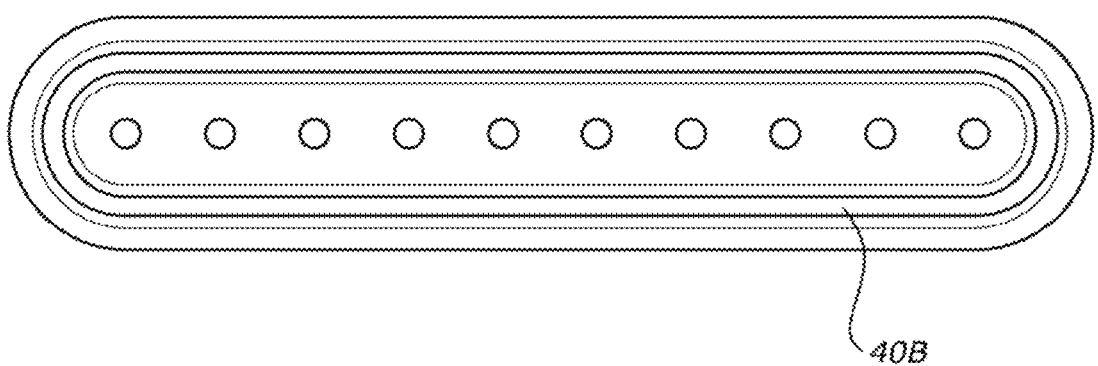
FIG. 5 shows a bottom side view of an ion source having a generally rectangular opening having rounded corners.

FIG. 4 for example shows a generally rectangular opening 40A having straight square ends so that the cross section of the resulting beam is a hollow rectangular shape having straight square ends. FIG. 5 shows a generally rectangular opening 40B having rounded corners so that the cross section of the resulting beam is a hollow rectangular shape having rounded corners.

Advantageously the rectangular configuration facilitates deposition over an elongated surface area. U.S. Pat. No. 8,134,287 (Price), for example, describes and shows an ion source having an elongated rectangular opening with rounded corners or ends.

Figure 6:
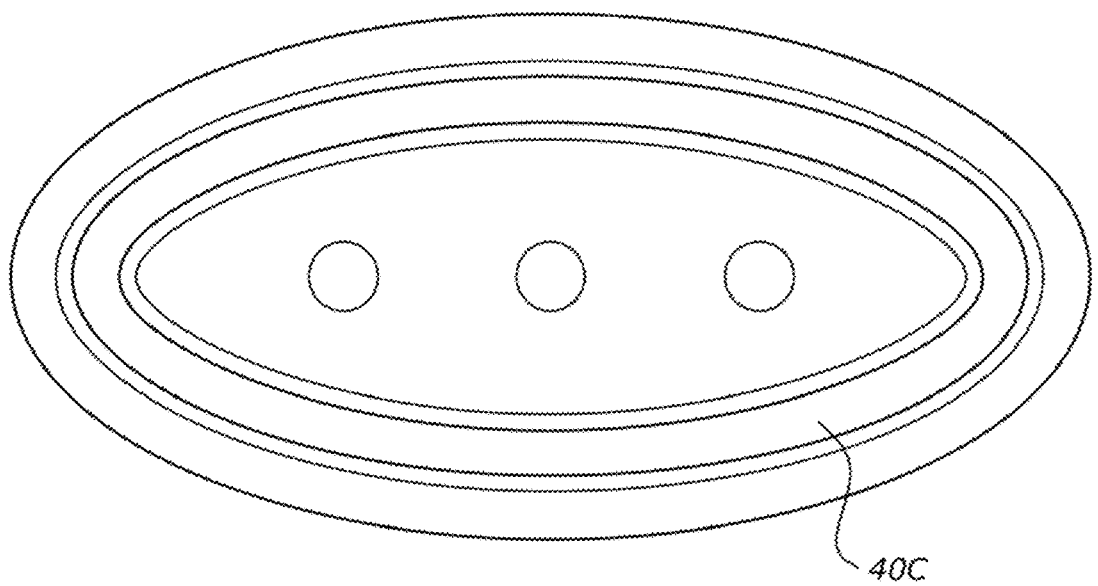
FIG. 6 shows a bottom side view of an ion source having a generally oval or elliptic opening.
Figure 7:
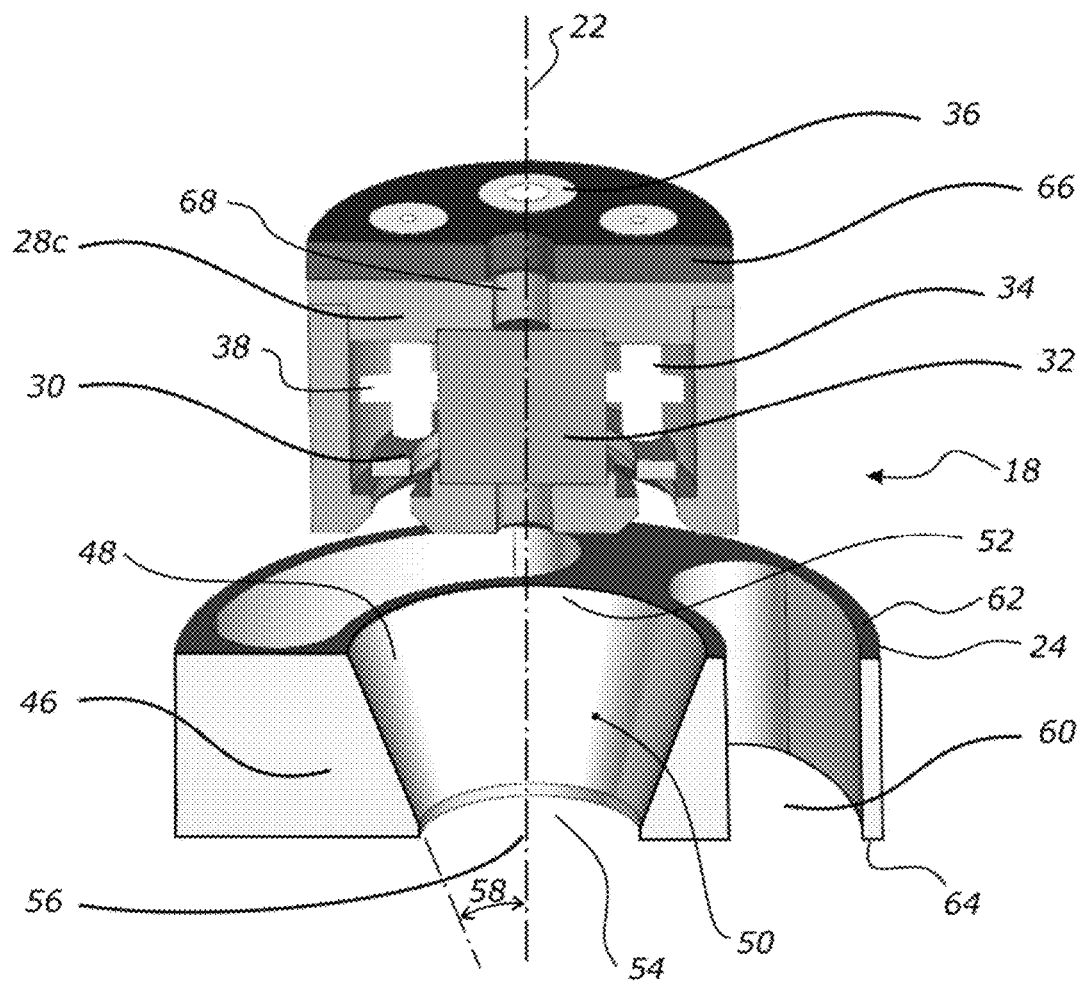
FIG. 7 shows a schematic cross sectioned side view of the ion source and the sputtering target of the sputtering apparatus of FIG. 1.

FIG. 6 shows an opening 40C in the form of an oval or elliptic opening so that the cross section of the resulting ion beam is a hollow oval or elliptical shape.

The sputtering target 24 has a target body 46 that defines at least one target surface 48 for the ion beam 20. The sputtering target body 46 comprises sputterable particles. In an embodiment, the sputterable particles include, but are not limited to, metals, metal oxides and/or semiconductors. Examples of metals of interest include copper, gold, platinum, titanium, tungsten, tin, indium, rhodium, samarium, iron, cobalt, nickel, chromium, zinc and alloys of these metals. Examples of metal oxides of interest include zinc oxide, magnetite, titanium oxide, and tungsten oxide. Examples of semi-conductors encompasses oxides such as zinc oxide, tungsten oxide and indium-tin oxide. Non-oxide semiconductors examples include silicon and germanium as well as compounds such as gallium arsenide.

In an embodiment the sputtering target is made of a single material so that the faces exposed to the beam provide the sputterable particles.

For example, the sputtering target body 46 may be a body that comprises copper (for heat dissipation) and other non-copper sputterable particles. In an embodiment, heat dissipation of the sputtering target 24 is ensured by direct conduction of heat to the outside environment.

The sputtering target can also be made with more than one materials. For example, the body of the sputtering target can be made of a first material comprising a heat conductive materials such as aluminium or copper.

For an elongated shape, such as rectangles with rounded ends, slots can be manufactured from the body of the sputtering target to allow for inserting plates, or inserts, of a second material or further materials where the beam is expected to hit the sputtering target.

In an embodiment, the inserts are made of the same materials on both sides of the sputtering target or of different materials. For example, one side can be made of iron and the other of nickel. As the beam simultaneously hits both inserts, different sputtered particles are deposited on the samples being processed. One example includes forming an alloyed layer on the surface such as iron-nickel.

In an embodiment, the inserts are mechanically pressed on the sputtering target body to maximise heat exchange to the body of the sputtering target, allowing for heat dissipation.

In an embodiment using inserts, the sputtering target comprises a low sputtering yield material to avoid contamination. Example of such low sputtering yield materials include but are not limited to aluminium and graphite.

In an embodiment, the first material and the second material are positioned at substantially the same angle of incidence with respect to the hollow ion beam.

In another embodiment, the sputtering body does not present a symmetrical section so that the inserts can be present at different angle of incidence with respect to the ion beam. The first material is positioned at a first angle of incidence with respect to the hollow ion beam and the second material is positioned at a second angle of incidence with respect to the hollow ion beam. The first angle of incidence is different to the second angle of incidence.

This allows for controlling the sputtering yield of the different materials comprising the insert. For example, one side of composition A can have a smaller angle than the other side of composition B in order to produce a deposited layer with composition of $A_x B_{1-x}$ where x is a function of the incidence energy, angles of each inserts A and, height at which the beam hits the inserts, and the composition of the insert A and B.

A first estimate of x can be obtained by calculating the sputtering of yields $Y_A$ and $Y_B$ of materials A and B respectively and calculating a ratio of the sputtering yields such as $x=Y_B/Y_A$.

In an embodiment, when using different angles, the sputtering target is shaped so that the distance between the ion source and the part of the inserts which is hit by the beam is the same for both insert A and B. This requires the distance $r_A$ between the centre axis of the beam and insert A to be different than the distance $r_B$ between the centre axis of the beam and insert B.

In an embodiment, the target body 46 has or defines a target passage or opening 50 that extends through the target body 46. The target passage 50 has an ion beam inlet 52 for an ion beam 20 from the ion source to enter the passage 50, and a particle outlet or exit 54 for sputtered particles to exit the target passage 50 towards a surface 12a to be modified.

The target passage 50 has a central passage axis 56 that intersects the inlet 52 and the outlet 54. The target passage 50 is substantially symmetrical about the central passage axis 56. The target body 46 may also be substantially symmetrical about the central passage axis 56.

The ion source 18 and the sputtering target 24 are retained within or by the housing 16 so that the inlet 52 is located upstream (with reference to the ion beam 20) of the particle outlet 54. The inlet 52 is located proximal or at least closer to the ion source 18 than the particle outlet 54 that is located distal or at least further from the ion source 18. The beam axis 22 intersects the inlet 52, the passage 50 and the outlet 54. The sputtering target 24 and the ion source 18 are linearly arranged so that the axis 56 of the passage 50 is substantially parallel, preferably parallel, more preferably substantially coaxial, more preferably coaxial with the beam axis 22.

A cross sectional shape of the ion beam inlet 52 (in a plane perpendicular to the beam axis 22) is substantially a circle. A cross sectional shape of the particle outlet 54 (in a plane perpendicular to the beam axis 22) is substantially a circle.

The ion inlet 52 is substantially centred on the beam axis 22. The outlet 54 is substantially centred on the beam axis 22. Alternatively, the cross sectional shape of each of the ion beam inlet 52 and the particle outlet 54 may be another shape, for example, substantially an oval, or a rectangle having rounded corners. The cross sectional shape of the inlet 52 may be different from the cross sectional shape of the outlet 54.

A cross sectional area of the ion beam inlet 52 (in a plane perpendicular to the beam axis 22) is substantially larger than a cross sectional area circumscribed by an external periphery of the ion beam 20 so that the ion beam enters the passage 50. In an embodiment, the diameter of the ion beam inlet 52 (in a plane perpendicular to the beam axis 22) is substantially larger than a diameter of the external periphery of the ion beam 20.

The target passage 50 is shaped to inhibit the ion beam 20 exiting the target passage 50 through the particle outlet 54 towards, or reaching, a surface 12a to be modified outside the passage 50, without hitting the target surface 48, as will described below. A cross sectional area of the particle outlet 54 (in a plane perpendicular to the beam axis 22) is substantially smaller than a cross sectional area of a hollow portion of the ion beam 20. In an embodiment, a diameter of the outlet 54 (in a plane perpendicular to the beam axis 22) is substantially smaller than a diameter of the circular hollow portion of the ion beam 20.

The target surface 48 is in the form of or provided by at least one passage or inner surface of the target body 46 that at least partly defines the passage 50. The target surface 48 is a substantially continuous passage surface. Alternatively, the target surface 48 may comprise two or more adjacently located surfaces. At least part of the target passage 50 intermediate the inlet 52 and the outlet 54 tapers (reduces in size) towards the particle outlet 54 so that the target surface 48 is sloped relative to the beam axis 22. The target passage 50 tapers from at or near the inlet 52 to at or near the outlet 54. The passage 50 tapers at a substantially constant rate. Alternatively, the passage 50 may taper at a non-constant rate, for example, the passage 50 may taper at a greater or lesser rate as the passage 50 gets closer to the outlet 54.

In an embodiment, the target passage 50 has a generally funnel shape, such as a substantially frustoconical (or truncated-cone) shape. An angle 58 defined between the sloped target surface 48 and the passage axis 56, and/or the beam axis 22, is between 0 degrees and 90 degrees. The angle 58 is preferably greater than or equal to 30 degrees, more preferably greater than or equal to 35 degrees. Alternatively, the target passage 50 may have another shape.

The sputtering target 24 comprises one or more vacuum vents 60. The or each vent 60 extends through the target body 46. The or each vent 60 extends through the target body 46 from a first end or part 62 of the target body 46 at or near the inlet 52 to a second end or part 64 of the target body 46 at or near the outlet 54. The sputtering target 24 has three vents 60. The vents 60 that are circumferentially spaced, preferably a substantially equal distance apart, around the passage axis 58/beam axis 22. The vents 60 may be extruded through the target body 46.

The sputtering apparatus 14 comprises a heat sink 66 that is coupled to the ion source 18 to dissipate heat from the ion source 18. The heat sink 66 cools the ion source 18 to maintain the operating temperature below the Curie temperature at which the strength of the magnet 32 is reduced and/or irreversibly impaired. In an embodiment, the heat sink 66 comprises a first component in the form of a circular plate 66a that is coupled to the cathode back piece 28c, a second component in the form of second circular plate 66b that is spaced apart from the first plate 66a and that is coupled to the housing 16, and a third component in the form of an elongate member or rod 66c that extends between the first plate 66a and the second plate 66b. A surface of the first plate 66a is contiguous to a surface of the back cathode piece 28c. The rod 66c extends into the cathode back piece 28c via an opening 68 in the back cathode piece 28c. The rod 66c is arranged to extract heat from the first plate 66a and/or the back cathode piece 28c to the second plate 66b and the housing 16. The heat sink 66 may, for example, comprise or be copper. By implementing a direct thermal connection between the ion source 18 and the environment outside the vacuum chamber 26, the temperature inside the source 18 is reduced. Alternatively or additionally, the heat sink 66 may comprise one or more other materials of relatively high thermal conductivity. Extra cooling can be provided, if necessary, from the outside the sputtering apparatus 14 using one or more air-heat or liquid-heat exchangers.

Figure 2A:
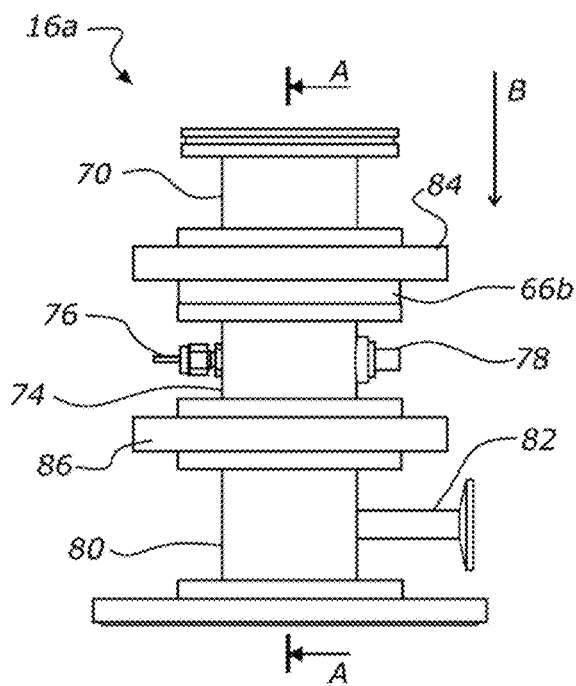
FIG. 2A shows a schematic side view of part of the ion source housing of the sputtering apparatus of FIG. 1.
Figure 2B:
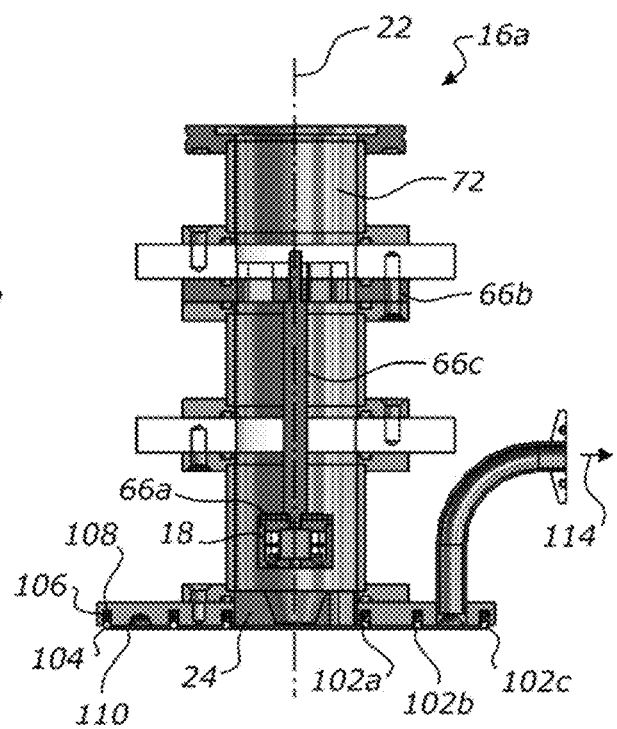
FIG. 2B shows a cross sectional view of the ion source housing, sectioned at the plane A-A in FIG. 2A.
Figure 2C:
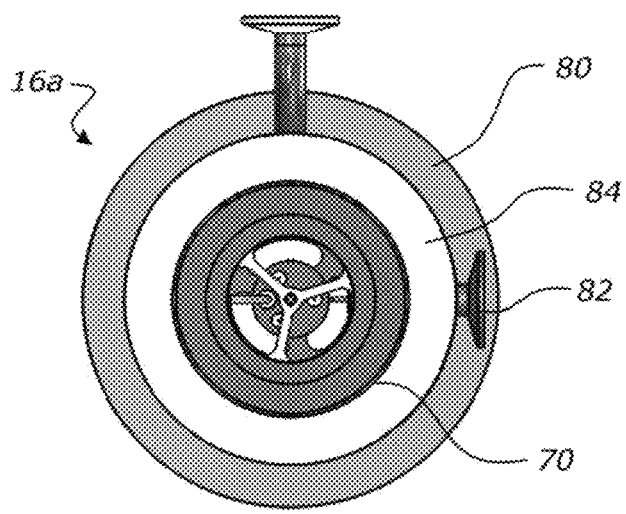
FIG. 2C shows a topside view of the ion source housing of FIG. 2A, in the direction labelled B in FIG. 2A.

Part 16a of the housing 16 that in use is located above (as shown in the figures) the surface 12a is shown in FIGS. 2a-2c. An embodiment housing 16 comprises a first, generally cylindrical or annular section 70 that houses a vacuum pump 72, a second, generally cylindrical or annular section 74 that includes a gas inlet or feed through 76 and a connector 78 for the anode voltage, and a third, at least partly generally cylindrical or annular section 80 that is configured to facilitate a seal at an interface of the housing 16 and the surface 12a to be modified. In an embodiment, the vacuum pump 72 is, for example, a turbomolecular pump that is arranged to establish and maintain a vacuum within the housing 16 and preferably substantially seal the housing 16 to the surface 12a at the housing-surface interface. The pump 72 may vacuum through the vents 60 to maintain a good level of vacuum. The connector 78 for the anode voltage may be, for example, a Bayonet Neil Concelman (BNC) connector. The third section 80 has a flange 82 for a vacuum gauge used to measure the pressure within at least part of the vacuum chamber 26 defined by the housing 16. The first and second sections and the second and third sections are each separated by a respective insulator 84, 86.

In an embodiment, the ion source 18 and the sputtering target 24 are moveable relative to a surface 12a to be modified. In one embodiment, the ion source 18 and the sputtering target 24 are actuateable and slideable on the stationary surface 12a being processed, such as in a direction or directions 88 that are substantially perpendicular to the beam axis 22. In another embodiment, the surface 12a to be modified is slid under or in front of the static ion source 18 and the static sputtering target 24.

It may be possible to establish a small vacuum on difficult to seal substrates, such as rough substrates like wood or leather, by restraining the area in contact with the housing 16 at the housing-surface interface and placing further pumping mechanisms on both sides 12a, 12b of the surface be modified. Surfaces of soft substrates may also be able to be processed by clamping the substrate with one or more clamps 90 inside the vacuum chamber 26 to reduce leakage. Heating the area locally around interface between the housing 16 and the substrate 12 with surfaces 12a, 12b has also been found to help achieve a vacuum faster.

Figure 8:
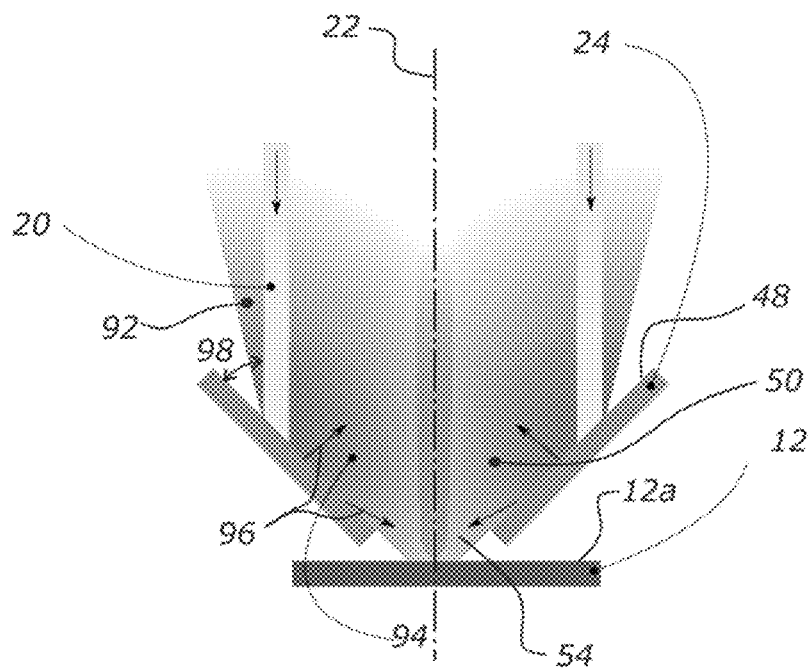
FIG. 8 shows a schematic cross sectional side view of the sputtering target of the sputtering apparatus of FIG. 1 being used to sputter particles onto a planar surface.
Figure 9:
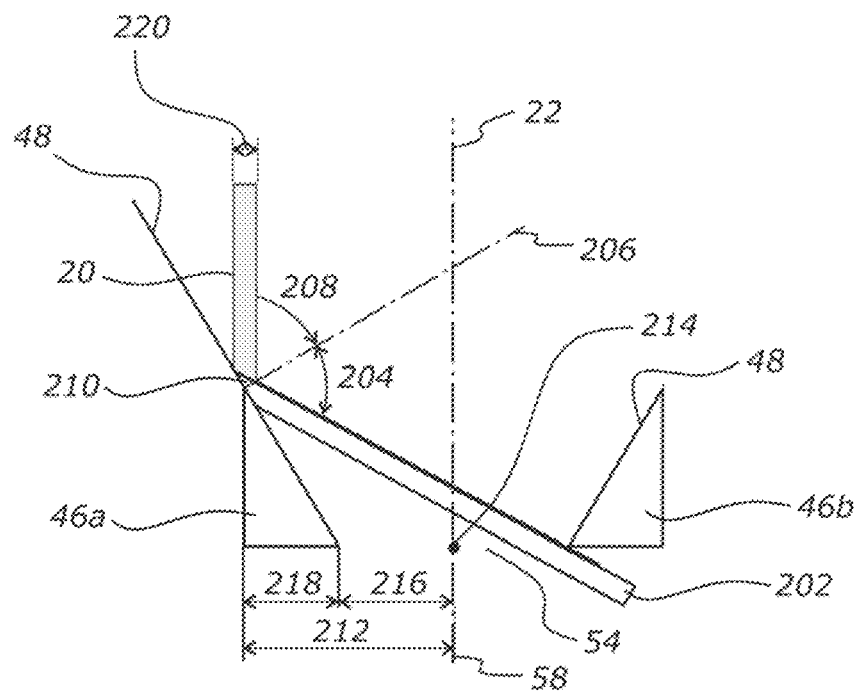
FIG. 9 shows a partial schematic cross sectional side view of part of the ion beam and the sputtering target of the sputtering apparatus of FIG. 1.

Sputtering Method (FIGS. 8 and 9)

A method of sputtering particles onto a surface 12a of an object to be modified using the sputtering apparatus 14 will be described with reference to FIGS. 8 and 9. In an embodiment shown in FIGS. 1-9, the object is a substrate 12 and the surface 12a is a substantially planar surface of the substrate. In alternative embodiments, the surface 12a may be substantially non-planar. In alternative embodiments, the object may be a conduit, for example, a tube or pipe having an arcuate outer surface that may be rotated under the outlet 54.

The surface 12a is located adjacent the particle outlet 54 of the sputtering apparatus 14, outside the target passage 50. The housing 16 that is part of and/or associated with the sputtering apparatus 14 at least partly defines a vacuum chamber 26 for the ion source 18 and sputtering target 24. A partial vacuum is created in the vacuum chamber 26, typically less than $10^{-4}$ mbar. In one embodiment, the partial vacuum created in the vacuum chamber 26 is in the range of about $5\times10^{-6}$ mbar to about $3\times10^{-5}$ mbar, preferably below about $5\times10^{-5}$ mbar. The housing 16 is arranged to substantially seal against the opposed surfaces 12a, 12b of the substrate. Voltages are applied to the cathode 28 and to the anode 30, with a voltage differential between the anode 30 and the cathode pieces 28a, 28b, 28c sufficient to induce plasma formation at a given partial pressure. The voltage differential is typically in the range of about 500 V to about 3 kV, typically in the range of about 1 kV to about 2 kV. The voltages are derived from an electrical power supply that is external to the housing 16. The voltages have a positive polarity with reference to the sputtering target 24, which is preferably at earth or ground potential. A small input of gas, for example a gas comprising an inert gas such as argon, is introduced via the inlet 76. At these pressures, and with the voltages applied and the gas introduced between the cathode 28 and the anode 30, the ion source 18 generates a plasma. The source 18 generates or provides a high energy ion beam 20 by stripping positively charged ions from the plasma that are directed or accelerated outwardly through the opening 40 by the high potential difference, along the beam axis 22, towards the sputtering target 24. In an embodiment, the ion beam 20 has a potential or accelerating energy of greater than or equal to about 500 V, preferably in the range of about 1 kV to about 30 kV, more preferably in the range of about 15 kV to about 25 kV.

The thin hollow beam 20 passes through the ion beam inlet 52, and into the passage 50 of the sputtering target 24 that is located directly below the ion source 18. The ion beam 20 hits, or strikes or bombards, the target surface 48 to sputter or eject particles (schematically indicated with red shading) from the body 46 of the sputtering target 24 towards the surface 12a. The body 46 of the sputtering target 24 is gradually eroded. The particles sputtered towards the surface 12a pass through the outlet 54 of the sputtering target 24, and are deposited on the substrate located directly underneath.

In an embodiment, the high energy source's circular opening 40 and the circular outlet 54 results disc-shaped deposits on the surface 12a. In another embodiment the ion source 18, the opening 40 and the resulting beam 20 may have a rounded-corner rectangular shape. This configuration allows uniform deposition over elongated areas. Advantageously, the sputtering apparatus 14 can be scaled for large linear shapes and to increase the area deposited simultaneously.

Although it will be appreciated that some particles (generally indicated by reference number 92) are sputtered from the sputtering target back towards the ion source, the particles (generally indicated by the reference number 94) sputtered towards the surface are generally sputtered from the sputtering target in radially extending sputter directions as generally indicated by the arrows 96 relative to the beam axis 22 that are one of (i) directions extending towards the beam axis 22 and (ii) directions extending away from the beam axis 22. In an embodiment shown in FIGS. 1-9, the radially extending sputter directions are directions radially extending directions towards the beam axis 22 and the sputtering apparatus 14 is arranged to sputter particles from the sputtering target 24 over the full circumference of the ion beam 20.

Ions back-sputtered from the sputtering target towards the ion source can coat the insulators 34, 36 inside the ion source 18. In order to avoid this back deposition causing shorts, in an embodiment the insulators 34, 36 are shaped to increase exposed surface areas so as to limit the rate of thickness increase of any back deposition. Some areas of the insulators 34, 36 can also be masked from direct exposure to the back deposited ions to limit the rate of thickness increase.

The shape of the target passage 50, and/or the size of the outlet 54, inhibits and/or prevents the ion beam 20 reaching the surface to be modified. The smaller diameter of the passage 50, downstream of the inlet 52, and the outlet 54 prevent the ion beam 20 from reaching the surface 12a. The ion beam 20 instead hits the inclined surface 48 of the sputtering target 24, which is progressively eroded. In an embodiment, the angle (or angles) of incidence of the ion beam (being the angle between the ion beam 20 and a line perpendicular to the target surface 48 at the point of incidence between the ion beam 20 and the target surface 48) is greater than or equal to about 45 degrees. That is, the glancing angle 98 of the ion beam (being the angle between the ion beam 20 and the surface 48 of the sputtering target 24 at the point of incidence) is less than or equal to about 45 degrees. In an embodiment, the angle of incidence is in the range of about 60 to about 80 degrees (glancing angle of the ion beam is in the range of about 10 to about 30 degrees).

With reference to FIG. 9 (which shows part of the ion beam 20 and the sputter target 24), a majority or larger part of the sputtered particles will be projected in a main direction (generally corresponding to a direction of a beam of sputtered particles 202) that makes an angle 204 relative to a normal axis 206 that is perpendicular to the surface 48 of the sputtering target 24. This angle 204 is generally close to or the about the same as the angle of incidence 208 of the ion beam 20.

In an embodiment, the particle outlet 54 needs to be large enough so that the main direction of sputtering from the point of incidence 210 (indicated at the centre of the width 220 the ion beam 20) at one side 46a of the sputter body 46 is not obstructed by the opposite side 46b of the sputter body 46. In one embodiment, for example, the distance 212 between the centre point 214 of the particle outlet 54 (or the passage axis 58/beam axis 22) in a direction perpendicular to the passage axis 58/beam axis 22 is equal to or greater than the sum of (i) the distance 218 in a direction perpendicular to the passage axis 58/beam axis 22 between the point of incidence 210 and the edge of the particle outlet 48 and (ii) and the distance 216 in a direction perpendicular to the passage axis 58/beam axis 22 between the edge of the particle outlet 48 and the centre point 214.

Sputter yield varies and can be controlled by the energy and angle of incidence of the bombarding ions. In an embodiment, the potential or accelerating energy of the ion beam 20 and/or the angle of incidence (or alternatively the angle 98 of the ion beam 20 and the surface 48 of the sputtering target 24 at the point of incidence) are selected to optimise the sputtering yield retrieved from the ion beam sputtering conditions.

There is an energy for each combination of incident ion species, sputtering target materials and incidence angle or angles that leads to a maximum of sputtering yield. In one embodiment, for example, the optimum sputtering yield with a majority of positively charged argon ($Ar^+$) ion beam with an angle of incidence between about 55 and about 75 degrees is reached with ion energies between 15 and 20 keV.

Similarly there is an angle of incidence for each combination of incident ion species, sputtering target materials and beam energy that leads to a maximum of sputtering yield. In one embodiment, for example, the optimum sputtering yield with a majority of $Ar^+$ ion beam with energies between about 15 and 20 about keV is reached with an incidence angle of between about 55 to about 75 degrees.

A further high voltage bias may be applied between the sputtering target 24 and ground to provide an acceleration voltage to any ionised sputtered atoms. The voltage bias is advantageous when using the sputtering apparatus 14 to implant atoms and molecules from the sputtering target 24 onto and/or into a surface 12a. In one embodiment, the voltage bias applied between the sputtering target 24 and ground is in the range of, for example, about 1 kV to about 50 kV. A voltage bias in this range (about 1 kV to about 50 kV) is understood to be advantageous for providing an acceleration voltage without the need for large additional electrical isolation and radiation shielding. In another embodiment, the voltage bias applied between the sputtering target 24 and ground is in the range of, for example, about 15 kV to about 20 kV. A voltage bias in this range (about 15 kV to about 20 kV) is understood to be advantageous for creating surface and near surface nanoparticles of most metallic elements on and within organic and inorganic substrates.

In an embodiment, the sputtering apparatus 14 optionally comprises a stencil 100 at or near the outlet 54 that defines a pattern for depositing the sputtered particles onto the surface 12a according to the pattern. In an embodiment, the method comprises locating the stencil 100 adjacent the particle outlet 54 so that the stencil 100 at least partly extends across the particle outlet 54.

In one embodiment, an electron gun (not shown) is pointed at or near the exit of the sputtered atoms to promote the positive ionisation of the sputtered atoms.

In an embodiment, the sputtering apparatus 14 is or forms part of a dynamic vacuum system that facilitates deposition of material on planar surfaces 12a, particularly large area planar surfaces.

The housing 16, the ion beam source 18 and the sputtering target 24, are moveable relative to the surface 12a to be modified. In an embodiment, the method comprises moving or feeding the surface 12a from, for example, atmospheric pressure (outside the housing 16) into the vacuum chamber 26 at least partly defined by the housing, in front of the deposition beam with sputtered particles from the sputtering target 24. A dynamic seal of the vacuum chamber 26 allows an active pressure gradient to be set between the ion source 18 and the surface 12a to be processed.

In an embodiment, the sputtering apparatus 14 has one or more dynamic seals 102a, 102b, 102c for forming a seal at the interface between the housing and the surfaces 12a, 12b of the substrate. In an embodiment the sputtering apparatus has three concentrically arranged seals 102a, 102b, 102c for each of the upper (as seen in the figures) surface 12a and the lower surface 12b.

In an embodiment, each seal 102a, 102b, 102c is formed from two different components each having low gas permeability. One component is a low friction non-compressible member 104 formed of a rigid material, such as Teflon. The second component is formed from a compressible elastic member 106, such as on O-ring. Each seal 102a, 102b, 102c encloses an area between two surfaces 110, 12a that is subject to a pressure gradient. The first rigid component 104 sits within a recess 108 formed in a first surface 110 of the housing 16. The second elastic component 106 is in contact with both the first rigid component 104 and the upper surface 12a (or lower 12b) of the substrate 12. The seals 102a, 102b, 102c work particularly well in situations where the surfaces 12a and/or 12b contains discontinuities and imperfections.

The area between adjacent concentric rings can be partially vacuumed so a pressure gradient is created. For example, a first or primary pressure may be induced inside the innermost seals using the vacuum pump 72, as indicated by the arrows 112. A second pressure that is higher than the first pressure may by induced by one or more further pumps in between outer concentric rings, as indicated by the arrows 114. An over pressure (high pressure) region outside the concentric rings can be used to further isolate the vacuum chamber 26 from the outside environment.

Advantageously, an embodiment sputtering apparatus 14 does not require the object 12 having the surface 12a to be modified to be arranged perpendicularly to the ion beam 20. The object 12 can instead be aligned in line (or linearly), for example directly underneath, the ion source 18 and the beam 20. In consequence, advantageously the vacuum chamber 26 for the ion source 18 and sputtering target 24 can be made smaller. In consequence, advantageously an embodiment sputtering apparatus 14 can be simpler and cheaper to manufacture.

An embodiment sputtering apparatus 14 makes it possible to deposit thin patterned and/or uniform films patterned or uniform across substantially the whole surface 12a below. Again for example only, applications can include but are not limited to deposition of electrodes, arrays of materials having different wetting properties, low emissivity layers, aesthetic coatings, reflective surfaces, electromagnetic shielding layers or films, wear or abrasive resistant layers or films, antibacterial surfaces and anti-fouling surfaces.

Figure 10C:
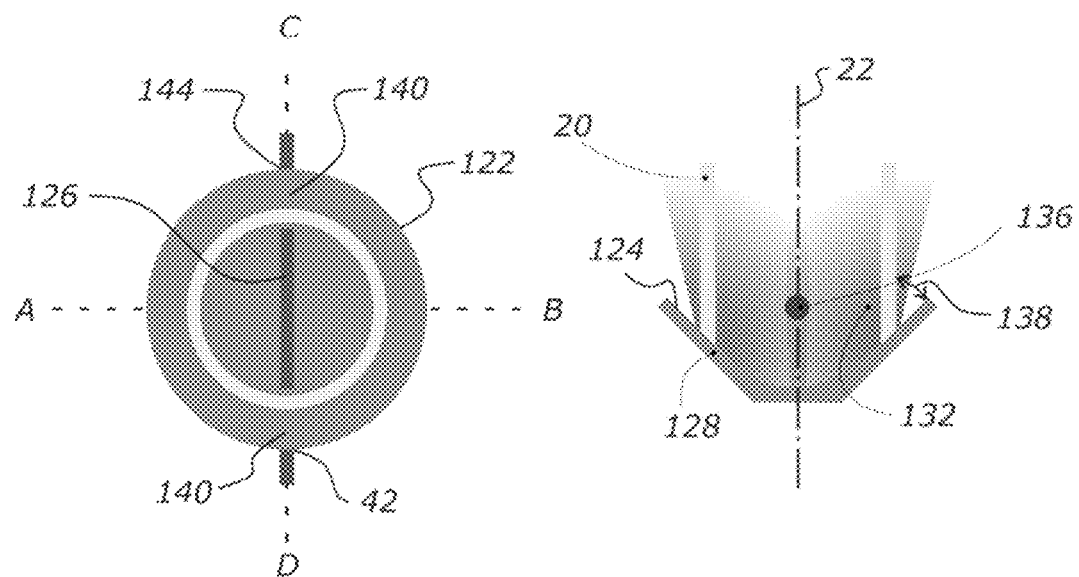
FIG. 10C shows a cross sectional side view of the sputtering target of FIG. 10A, sectioned in the plane C-D in FIG. 10A.
Figure 10C:
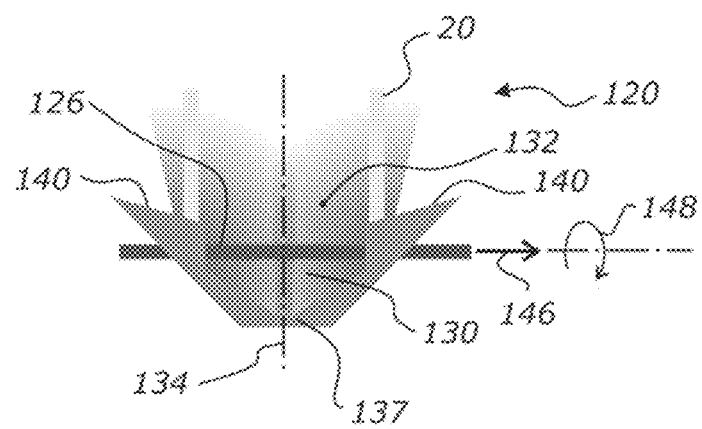

Sputtering Apparatus (FIGS. 10A-10C)

Alternative sputtering apparatus 120 according to a second embodiment of the present disclosure will be described with reference to FIGS. 10A-10C. The sputtering apparatus 120 comprises an ion source 18 for providing a high energy ion beam 20, as described above, and a sputtering target 122 that is shown schematically in FIGS. 10A-10C. The source 18 (not shown in FIGS. 10A-10C) is again operated under the vacuum, and is again located in a housing (not shown) relative to the sputtering target 122 so as to provide an ion beam 20 that hits a target surface 124 of the sputtering target 122 to sputter particles from the sputtering target 122 towards a surface 126 to be modified.

Unlike the sputtering target 24 that has a passage 50 for the ion beam 20, however, the sputtering target 122 comprises a target body 128 that defines a sputtering chamber 130 for modifying or coating a surface 126 that is located within the sputtering chamber 130 with sputtered particles (schematically indicated with red shading).

The target body 128 has an ion beam inlet 132, or opening or mouth, for the ion beam 20. The inlet 132 opens into the sputtering chamber 130. A cross sectional shape of the ion beam inlet 132 (in a plane perpendicular to the beam axis 22) is again substantially a circle (or ring). The ion beam inlet 132 is substantially centred on the beam axis 22. Alternatively, a cross sectional shape of the ion beam inlet 132 may again be other shapes, for example, substantially an oval, or a rectangle having rounded corners. A cross sectional area of the ion beam inlet 132 (in a plane perpendicular to the beam axis 22) is substantially larger than a cross sectional area circumscribed by an external periphery of the ion beam 20 so that the ion beam 20 enters the chamber 130. In an embodiment, the diameter of the ion beam inlet 132 (in a plane perpendicular to the beam axis 22) is substantially larger than a diameter of the external periphery of the ion beam 20.

The beam axis 22 intersects the ion beam inlet 132 and the sputtering chamber 130. The sputtering chamber 130 has a central chamber axis 134 that is substantially coaxial with the beam axis 22. The sputtering chamber 130 is generally symmetrical about the central chamber axis 134 and/or the beam axis 22. The target body 128 may also be generally symmetrical about the central chamber axis 134 and/or the beam axis 22.

The sputtering chamber 130 is shaped so that the particles sputtered towards an object 136 having a surface 126 to be modified are generally sputtered towards a central region within the sputtering chamber 130 (in which a surface to be modified can be located). The target surface 124 is in the form of or provided by at least one chamber or inner surface of the target body 128 that at least partly defines the chamber 130. In an embodiment, at least part of the sputtering chamber 130 intermediate the ion beam inlet 132 and an end part or base 137 (as seen in FIGS. 10B and 10C) of the sputtering chamber 130 that is downstream (with reference to the ion beam 20) of the inlet 132 tapers (reduces in size) in a direction towards the base 137 so that the target surface 124 is sloped relative to the beam axis 22. The sputtering chamber 130 tapers from at or near the ion beam inlet 132 to at or near the base 137 opposite the inlet 132. The chamber 130 tapers at a substantially constant rate. Alternatively, like the passage 50, the chamber 130 may taper at a non-constant rate, for example, the chamber 130 may taper at a greater or lesser rate as the chamber 130 approaches the base 137.

In an embodiment, the chamber 130 has a substantially frustoconical shape. An angle 138 defined between the sloped target surface 124 and the chamber axis 134 and/or the beam axis 22 is less than or equal to about 45 degrees. The angle 138 is preferably in the range of about 10 to about 30 degrees. Alternatively, the chamber 130 may have another shape.

The sputtering target 122 comprises one or more shields, or guards or formations, 140. In an embodiment, the sputtering target 122 comprises two shields 140. The or each shield is arranged to inhibit or prevent the ion beam 20 hitting (or reaching) the surface 126 to be modified within the sputtering chamber 130. The shields 140, in use, are located at least partly upstream (with reference to the ion beam 20) of the surface 126 being modified. Each shield 140 extends partly across the inlet 132, extending in both radial and circumferential directions (with reference to the beam axis 22) to block or shield a surface 126 being modified that extends under and/or through (as shown FIGS. 10B and 10C) the shields 140 from the ion beam 20. The target body 128 and the shields 140 may be formed as a unitary part.

Like the ion beam inlet 52 of the sputtering target 24, a cross sectional shape of the ion beam inlet 132 (in a plane perpendicular to the beam axis), not including the shields 140, is substantially a circle (or ring). Alternatively, a cross sectional shape of the ion beam inlet 132 may be other shapes, for example, substantially an oval, or a rectangle having rounded corners.

The sputtering apparatus 120 comprises or is associated with a support feature for at least partly supporting (or holding or suspending) an object 136 having a surface 126 to be modified within the sputtering chamber 130. In an embodiment, the target body 128 has opposed apertures or openings 142, 144, and the object 136 may extend through apertures 142, 144 so that the object 136 at least partly extends across and within the sputtering chamber 130. The apertures 142, 144 may be formed through respective shields 140.

In an embodiment, the ion source 18 and the sputtering chamber 130 are moveable relative to a surface 126 to be modified, for example, in a direction 146 that is substantially perpendicular to the beam axis 22. The object 136 may be fed through the sputtering chamber 130 in a direction that is perpendicular to the beam axis. In an embodiment, the ion source 18 and the sputtering target 122 are rotatable relative to the surface 126, for example, about an axis that is perpendicular to the beam axis. For example, the object 136 comprising the surface 126 may be rotated relative to the stationary sputtering target as indicated by the arrow 148.

A method of sputtering particles onto a surface 126 of an object 136 to be modified using sputtering apparatus 120 comprising the sputtering target 122 will be described.

The object 136 is located within the sputtering chamber 130 so that the surface 126 at least partly extends across the sputtering chamber 130. In an embodiment, the object 136 extends through the apertures 142, 144 in the target body 128 and or the shields 140 and extends across the sputtering chamber 130. In an embodiment, the object 136 extends across the width of the sputtering chamber 130 in a direction that is substantially perpendicular to the beam axis.

As described above with reference to the sputtering apparatus 14, a partial vacuum is created in a vacuum chamber that is at least partly defined by a housing (not shown) that is associated with and/or part of the sputtering apparatus 120. The ion source 18 is operated in the partial vacuum to generate or provide a high energy ion beam 20.

The hollow beam 20 is directed through the inlet 132 into the sputtering chamber 130 that is located directly below the ion source 18. The ion beam 20 hits the chamber surface to sputter particles (schematically indicated with red shading) from the body 128 of the sputtering target 122 towards the surface 126.

In an embodiment, the sputtering chamber 130 is shaped so that the particles sputtered towards the surface 126 to be modified are generally sputtered towards a central region within the sputtering chamber 130. Although some particles are back-sputtered from the sputtering target back towards the ion source 18, the particles sputtered towards the surface 126 are generally sputtered from the sputtering target 122 in radially extending sputter directions relative to the beam axis 22, in directions extending towards the beam axis 22. In an embodiment, the sputtering apparatus 120 is arranged to sputter particles from the sputtering target 122 over the full circumference of the ion beam 20.

In the embodiment shown in FIGS. 10A-10C, the object 136 is an elongate conduit in the form of a cylindrical pipe or tube. The surface 126 is an outer arcuate or cylindrical surface. Alternatively the object 136 may be, for example, a substrate that has a planar surface.

In an embodiment, the method comprises moving or advancing the surface 126 to be modified relative to the ion beam 20 and/or the sputtering chamber 130. The surface 126 is moved relative to the sputtering chamber 130 in a direction 146 that is substantially perpendicular to the beam axis 22. In one embodiment, the object 136 is a pipe and is fed through the apertures in the stationary target body. In another embodiment, the sputtering target 122 (and the ion source 18) is moved along the stationary pipe.

In an embodiment, the method comprises rotating the object relative to the sputtering chamber 130 to sputter material around the entire circumference of the object. In one embodiment, the object is rotated (as generally indicated by the arrow 148) relative to the stationary target body 128. In another embodiment, the target body 128 (and the ion source 18) may be rotated relative to the stationary object.

Figure 11:
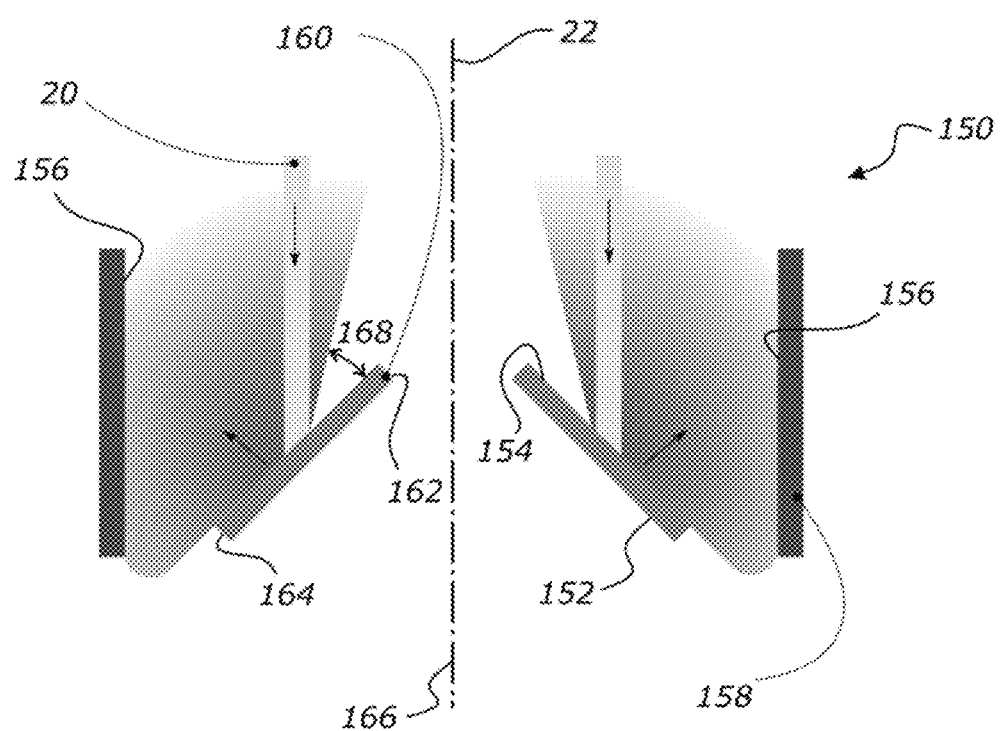
FIG. 11 shows a schematic cross sectional side view of a sputtering target of the sputtering apparatus according to a second embodiment of the present disclosure being used sputter particles onto an inner surface of a conduit.

Sputtering Apparatus (FIG. 11)

Alternative sputtering apparatus 150 according to a third embodiment of the present disclosure will be described with reference to FIG. 11. The sputtering apparatus 150 comprises an ion source 18 for providing a high energy ion beam 20, as described above, and a sputtering target 152 that is shown schematically in FIG. 11. The source 18 (not shown in FIG. 11) is again operated under the vacuum, and is again locatable in a housing (not shown) relative to the sputtering target 152 so as to provide the ion beam 20 that hits a target surface 154 of the sputtering target 152 to sputter particles from the sputtering target 152 towards a surface to be modified.

The sputtering target 152 is particularly useful for sputtering or depositing particles onto an inner surface 156 of a conduit, for example an inner surface of a pipe 158, tube, or barrel.

Unlike the sputtering apparatus 14, 120 in which particles sputtered towards the surface are generally sputtered from the sputtering target in radially extending sputter directions (relative to the beam axis) towards the beam axis, the sputtering apparatus 150 having the sputtering target 152 generally sputters particles towards the surface 156 in radially extending sputter directions relative to the beam axis 22 that away from the beam axis 22.

The sputtering target 152 comprises a target body 160 that is configured or shaped to sputter particles from the target body 160 towards the inner surface 156 of pipe 158.

The target body 160 has at least one outer, peripheral surface that defines the at least one target surface 154.

In an embodiment, at least part of the periphery of the annular target body 160 intermediate a first end 162 and a second end 164 has a substantially frustoconical shape so that the target surface 154 is sloped relative to the beam axis 22. With reference to FIG. 11, the target body 160 has a substantially hollow, frustoconical shape. The sputtering target 152 and the ion source 18 are linearly arranged so that an axis of the target body 166 is substantially parallel, preferably parallel, more preferably substantially coaxial, more preferably coaxial with the beam axis 22. An angle 168 defined between the sloped target surface 154 and the axis of the target body 166, and/or the beam axis 22 is less than or equal to about 45 degrees. The angle 168 is preferably in the range of about 10 to about 30 degrees. Alternatively, the target body 160 may have other shapes, for example, a substantially conical shape. Or the target body 160 may not have a circular cross section. The target body 160 may instead have, for example, substantially an oval cross section or a rectangle cross section having rounded corners.

Although the target body 160 shown schematically in FIG. 11 as a hollow body, alternatively the target body 160 may be a substantially solid body.

In an embodiment, a cross sectional area circumscribed by an external periphery of at least part the target body 160 (in a plane perpendicular to the beam axis 22) increases in a direction of the beam axis 22 in a direction away from the ion source 18 so that the ion beam 20 strikes the target surface 154. The cross sectional area circumscribed by the external periphery increases from, in the direction of the beam axis, in a direction away from the ion source 18 from a first cross sectional area that is substantially smaller than a cross-sectional area of the hollow portion of the ion beam 20 to a second cross sectional area that is substantially larger than a cross sectional area circumscribed by an external periphery of the ion beam 20. In an embodiment, the cross sectional area circumscribed by an external periphery of the target body 160 increases from at or near the first end 162 of the target body 160 proximal or at least closer to the ion source 18 to at or near the second end 164 of the target body 160 distal or at least further from the ion source 18 (downstream of the first end 162 with reference to the ion beam 20). In an embodiment, the diameter of the external periphery of the target body 160 increases from at or near the first end 162 to at or near the second end 164.

The cross sectional area circumscribed by an external periphery of target body 160 increases at a substantially constant rate in the direction of the beam 20. Alternatively, the cross sectional area defined by the periphery of target body 160 may taper at a non-constant rate, for example, the target body 160 may taper at a greater or lesser rate as the target body 160 gets closer to the second end 164.

In an embodiment, the sputtering apparatus 150 is configured to at least partly extend within a hollow object such as the pipe 158, so that the beam axis 22 is generally aligned with (substantially parallel to or coaxial with) a central or longitudinal axis of the pipe. The size of the ion source 18 and/or the sputtering target 152 can be made (scaled larger or smaller) based on the dimensions of the pipe.

In an embodiment, the sputtering target 152 is moveable relative to the pipe 158 in a direction that is substantially parallel to the beam axis 22. The sputtering apparatus 150 is configured so that at least the sputtering target 152 is moveable relative to and within the pipe in a direction that is substantially parallel to the beam axis 22. In an embodiment, the sputtering apparatus 150 is configured so both the ion source 18 the sputtering target 152 are moveable relative to and within the pipe in a direction that is substantially parallel to the beam axis 22. Alternatively, the sputtering target 152 may move within the pipe relative to ion source 18 that may be stationary.

A method of sputtering particles onto the inner surface 156 of the pipe 158 using sputtering apparatus 150 comprising the sputter body 152 will be described.

The sputtering apparatus 150 having the sputtering target 152 is located so that the sputtering target 152 is at least partly located within, and/or extends through an open end of the pipe 158, into the pipe. In an embodiment, the sputtering apparatus 150 is located so that the beam axis 22 is generally aligned with (substantially parallel to or coaxial with) a central or longitudinal axis of the pipe 158.

As described above with reference to the sputtering apparatus 14, 120, a partial vacuum is created in a vacuum chamber that is at least partly defined by a housing that is associated with and/or part of the sputtering apparatus 150. The pressure within at least a portion of the pipe 158 is lowered. The ion source 18 is operated to generate or provide a high energy ion beam 20.

The hollow beam 20 is directed on to the sputtering target 152 that is located adjacent, or directly below as seen in FIG. 11, the ion source 18. The ion beam hits the target surface 154 to sputter particles (schematically indicated with red shading) from the body of the sputtering target 152 towards the inner surface 156 of the pipe 158.

Again, although some particles are sputtered from the sputtering target 152 back towards the ion source 20, the particles sputtered towards the surface are generally sputtered from the sputtering target 152 in radially extending sputter directions relative to the beam axis 22, in directions extending away the beam axis 22. In an embodiment, the sputtering apparatus 150 is arranged to sputter particles from the sputtering target 152 over the full circumference of the ion beam 20.

The inner surface 156 of the pipe 158 is arcuate, more particularly cylindrical surface. Alternatively, the sputtering apparatus 150 having the sputtering target 152 may be used to sputter or deposit particles on to a non-arcuate surface, for example, a generally planar surface. Alternatively, the sputtering apparatus 150 having the sputtering target 152 may be used to modify an outer surface of a pipe or other object.

In an embodiment, the method comprises moving or advancing the surface 156 to be modified relative to the sputtering target 152. The surface is moved relative to the sputtering target 152 in a direction that is substantially parallel to the beam axis 22. In an embodiment the sputtering target 152 is supported substantially coaxially within pipe 158, and may be traversed through the length of the pipe 158 to treat the full length of the pipe. In an embodiment, the ion source 20 may be moved with the sputtering target 152. In another embodiment, the sputtering target may be moved within the pipe 158, away from or towards the ion source 18.

Figure 12:
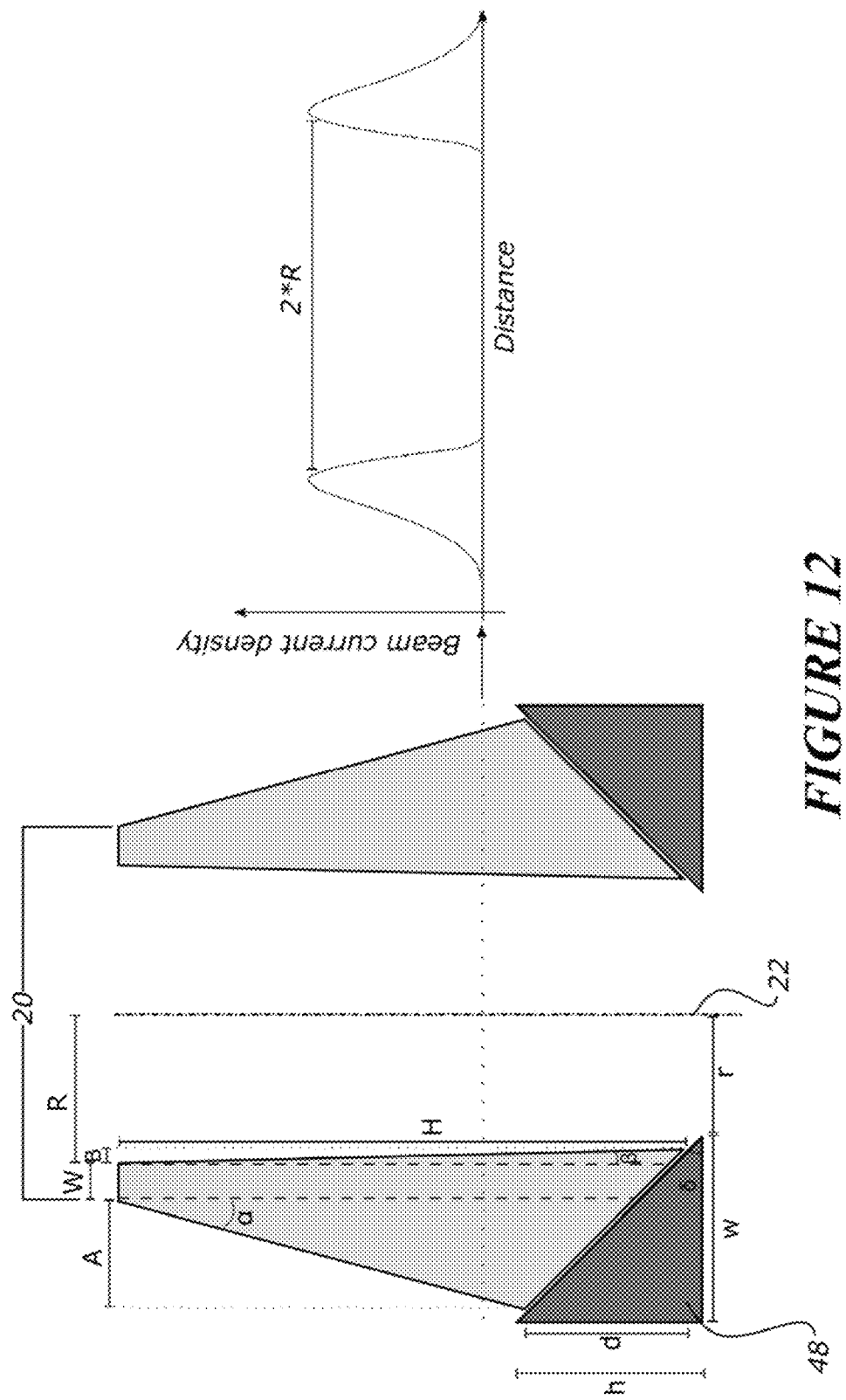
FIG. 12 shows an example of a hollow beam of an ion beam deposition system.

FIG. 12 shows an example of a hollow beam 20. As described above, a hollow beam is a cylindrical ion beam having a circular section with low to no ions streaming through a centre of the cylinder, and a maximum number of ions flowing through a wall of the cylinder.

An axis of the hollow beam is indicated at 22 with an inner radius R. A stream of ions of width W is directed toward a target surface 48. As the stream of ions travels toward the target surface 48 it exhibits an increase of the beam width A away from the beam axis 22. The stream of ions also exhibits an increase of the beam width B toward the beam axis 22.

In an embodiment, a transverse profile of the current density of hollow ion beam 20 will follow two mirroring asymmetrical Gaussian which are separated by a distance corresponding to the diameter 2R of the hollow beam 20. As the hollow ion beam propagates through space, Coulomb interaction within the ion beam will lead to the broadening of the beam and broadening of the walls. This is also known as the space charge effect.

The beam has a width W as the beam leaves the ion source. The beam travels a distance H toward the sputter target 48. The sputter target 48 has a geometry defined by an angle δ, a width w, and a height h. In an embodiment, most of the ion beam is stopped by the sputter target 48 so as not to damage or modify a substrate directly.

In an embodiment, the relationship between current and broadening of the ion beam 20 is a non-linear function of the pressure of the chamber, energy of the ions, their mass, the ion beam current density and the distance travelled H.

The broadening leads to an increase of the beam width of A away from the beam axis, and an increase in beam width B toward the beam axis. A broadening angle for A is shown as α. A broadening angle for B is shown as β.

In an embodiment, estimates of the corresponding broadening angles α and β are obtained by analytical approximations or the use of finite element modelling software and used to calculate A and B:

$$A = \frac{H - ((W + H\tan\beta)\tan\delta)}{\tan\delta + \cot\alpha}$$

$$B = H\tan\beta$$

The slope δ of the sputter target 48 is related to these values and the height of the sputter target so that:

$$d = (A+W+B)\tan\delta$$

The maximum inner radius of the sputter target is the inner radius r of the hollow ion beam as it hits the target:

$$a \leq r \leq R-B$$

Where a is the minimum radius of the deposition area (always positive). A particle outlet of the sputtering target has a width or radius of size a. In an embodiment this radius is defined by a user.

The minimum height h of the sputter target is:

$$h \geq d$$

The minimum width w of the sputter target section is:

$$w \geq A+W+B$$

The above equations are suited to the embodiment of the sputtering apparatus shown in FIGS. 10A-10C in which the sputter directions extend towards the beam axis. It will be appreciated that the same equations are suited to the embodiment of the sputtering apparatus shown in FIG. 11 in which the sputter directions extend away from the beam axis.

In the case that the angles of the sputtering target body on either side of the central axis are different, such as when using different materials to control the composition of the resulting deposited layer, the dimensions are not all the same. To calculate the geometry on either side of a sputtering target with materials A and B, the distance r is different on either side ($r_A$ for side A and $r_B$ for side B). $r_A$ and $r_B$ will be a function of the heights $d_A$ and $d_B$ and the slopes $\delta_A$ and $\delta_B$ which corresponds to the parameter d and δ for each side A and B.

In these conditions using a hollow beam has the potential to save power by a ratio of $$\frac{(W+r)^2}{(W+r)^2 - r^2}.$$

For instance if W=1 cm, r=1 cm, using a hollow beam uses ~33% less power than a full beam for the same sputtering rate. In addition, the surface is not affected by direct beam exposure.

Experimental results are described below. Running pressure for all experiments was maintained between 2 and $7\times10^{-4}$ mbar with a base pressure of about $5\times10^{-6}$ mbar.

Figure 13:
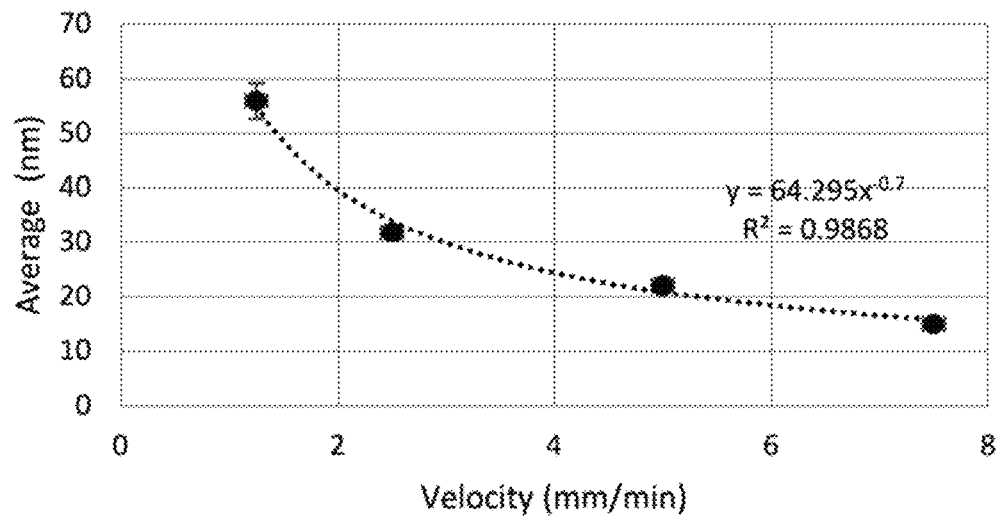
FIG. 13 shows a chart of the variation of average deposited copper thickness for different velocity of displacement of the sputtering system on glass.
Figure 14:
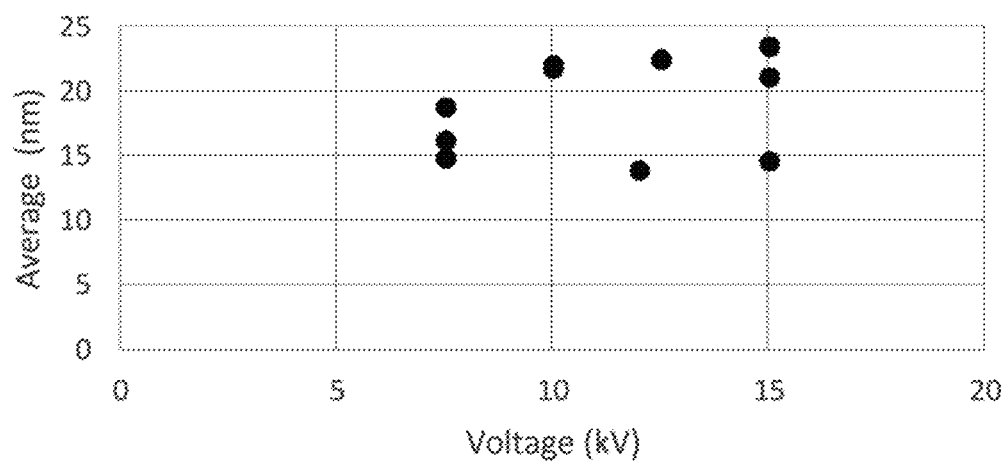
FIG. 14 shows a chart of the variation of average deposited copper thickness for different acceleration voltage of the sputtering system on glass.

FIGS. 13 and 14 show an example of copper deposition on glass. An elongated ion source such as that shown in FIG. 8 was used alongside a copper target with the same profile as shown in FIGS. 1 and 2B.

The length of the ion source was 15.7 cm and width of the hollow beam was 2.4 cm. The overall design of the vacuum chamber was the same as that shown in FIG. 2B. The distance between the target and the source was 1.35 cm. The distance between the bottom of the sputter target and the soda-lime glass substrate being modified was 0.5 mm.

The plasma was generated into the ion source by applying a DC voltage of 1 kV across the anode and cathode of the ion source. Voltages of 7.5, 10, 12, 12.5 and 15 kV were used to accelerate positive ions toward the sputter target. Scanning speed of 1.25, 2.5, 5 and 7.5 mm/min were used (using a geared stepper motor allowing resolution of ±0.1 mm/min). Different combinations were trialled, and the deposited thickness were measured using an Olympus portable X-ray Fluorescence system.

The thickness measurement was calibrated using atomic force microscopy. For the AFM measurement, a removable mask was put on the glass prior to deposition in order to present a sharp edge for thickness measurement.

FIG. 13 shows the variation of deposited thickness across the 12 cm of homogeneously deposited substrate for different scanning speed (Velocity) at constant acceleration voltage of 10 kV. FIG. 14 shows the variation of deposited thickness across the 12 cm of homogeneously deposited substrate for different scanning speed (Velocity) and for different acceleration voltage at a velocity of 5 mm/min. The vertical error bars correspond to the standard deviation of the thickness across the surface.

Figure 15:
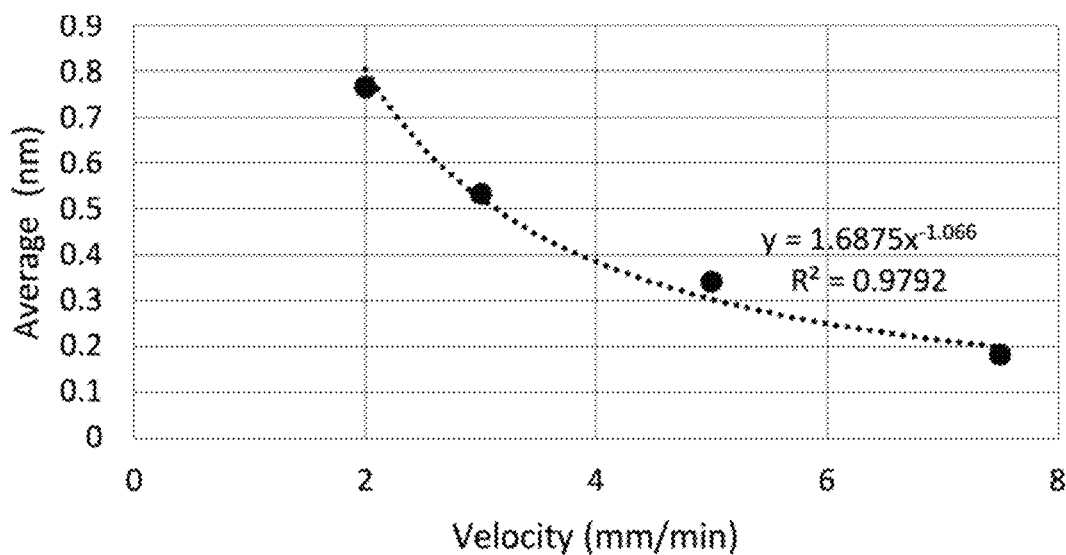
FIG. 15 shows a chart of the variation of average deposited titanium thickness for different acceleration voltage of the sputtering system on glass.

FIG. 15 shows an example of titanium deposition on glass.

An elongated ion source such as that shown in FIG. 8 was used alongside a sputtering target with the same profile as shown in FIGS. 1 and 2B.

The length of the ion source was 15.7 cm and width of the hollow beam was 2.4 cm. The sputter target had removable faces exposed to the ion beam which were made of titanium for this experiment. The overall design of the vacuum chamber was the same as that shown in FIG. 2B. The distance between the target and the source was 1.35 cm. The distance between the bottom of the sputter target and the soda-lime glass substrate being modified was 0.5 mm.

The plasma was generated into the ion source by applying a DC voltage of 1 kV across the anode and cathode of the ion source. Voltages of 5 kV were used to accelerate positive ions toward the sputter target. Scanning speed of 2, 3, 5 and 7.5 mm/min were used (using a geared stepper motor allowing resolution of ±0.1 mm/min). Different combinations were trialled, and the deposited thickness were measured using an Olympus portable X-ray Fluorescence system.

The measurement was calibrated using atomic force microscopy. For the AFM measurement, a removable mask was put on the glass prior to deposition in order to present a sharp edge for thickness measurement.

FIG. 15 shows the variation of deposited thickness across the 12 cm of homogeneously deposited substrate for different scanning speed (Velocity) at constant acceleration voltage of 10 kV. The vertical error bars correspond to the standard deviation of the thickness across the surface.

Figure 16:
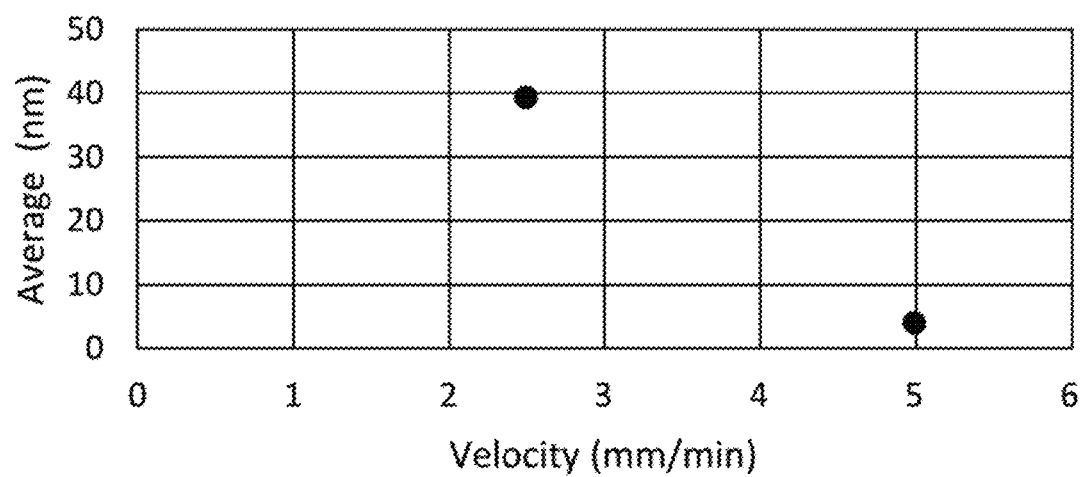
FIG. 16 shows a chart of the variation of average deposited copper thickness for different velocity of displacement of the sputtering system on glass.

FIG. 16 shows an example of copper deposition on the outside of a plastic tube.

Figure 3A:
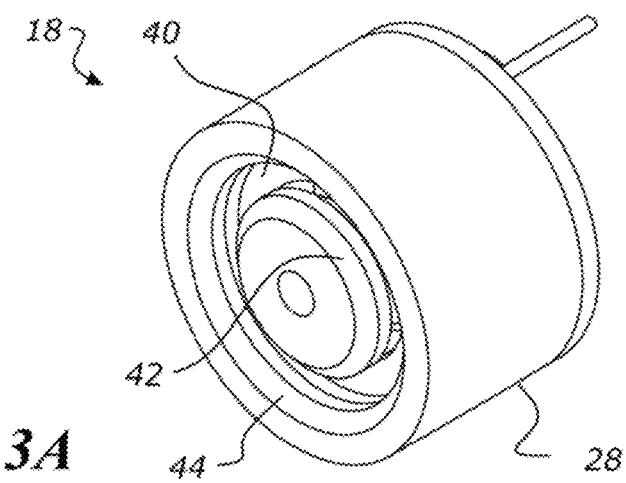
FIG. 3A shows a schematic perspective view of the ion source of the sputtering apparatus of FIG. 1.
Figure 3B:
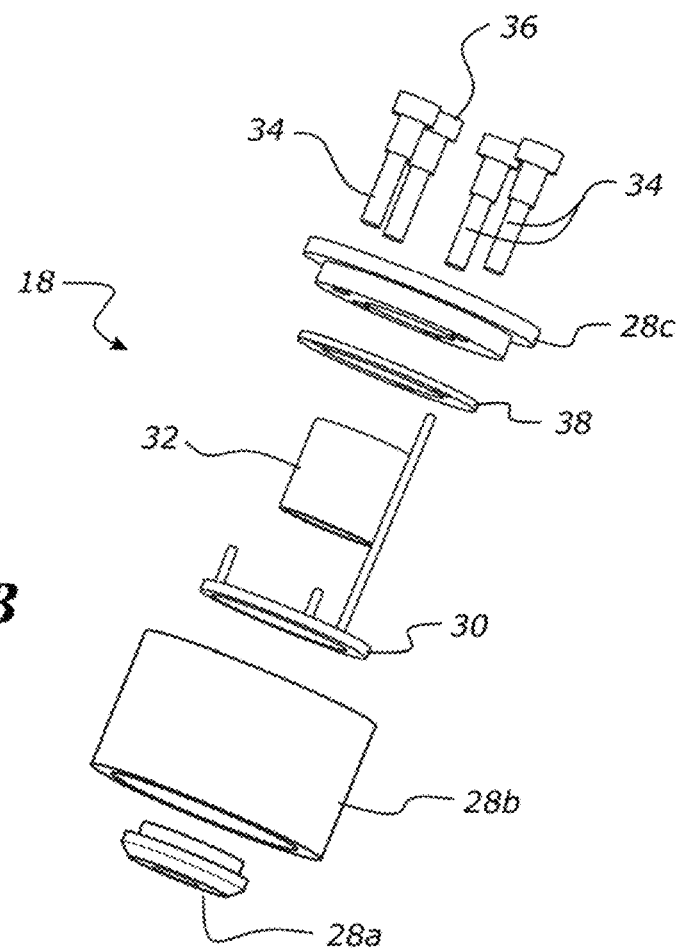
FIG. 3B shows an exploded perspective view of the ion source of FIG. 3B.
Figure 3C:
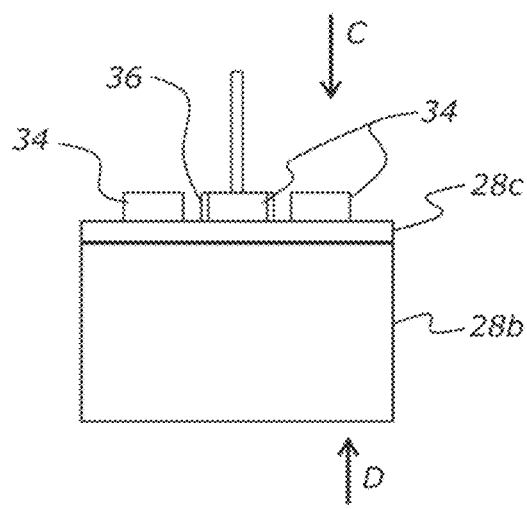
FIG. 3C shows a side view of the ion source of FIG. 3A.
Figure 3D:
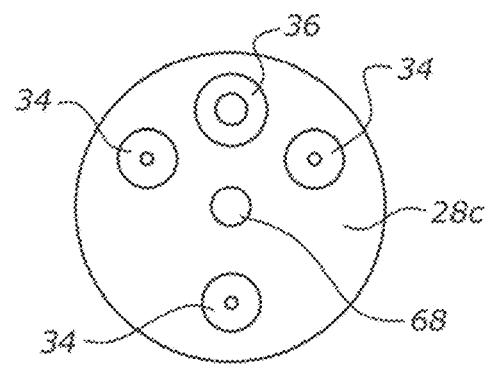
FIG. 3D shows a topside view of the ion source of FIG. 3A, in the direction labelled C in FIG. 3C.
Figure 3E:
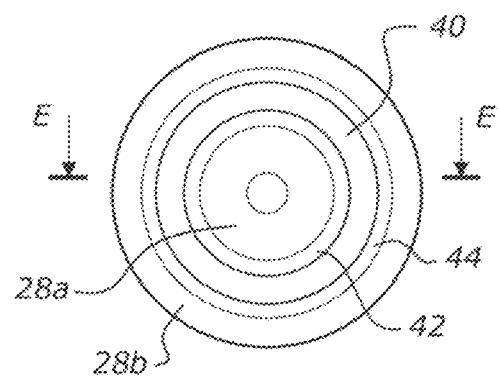
FIG. 3E shows a bottom side view of the ion source of FIG. 3A, in the direction labelled D in FIG. 3C.
Figure 3F:
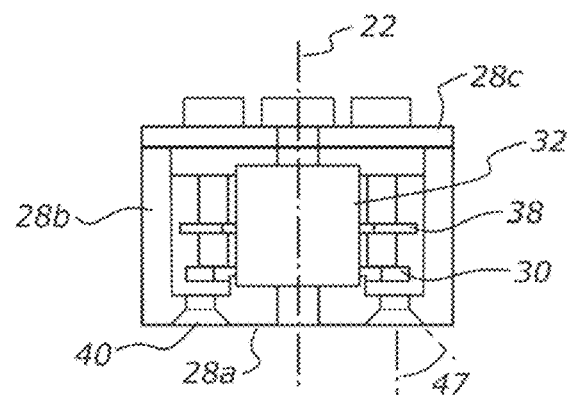
FIG. 3F shows a cross sectional view of the ion source of FIG. 3A, sectioned in the plane A-A in FIG. 3E.

A circular ion source such as that shown in FIG. 3A was used alongside a copper target with a design corresponding to FIGS. 10A, 10B, and 10C.

The plasma was generated into the ion source by applying a DC voltage of 1 kV across the anode and cathode of the ion source. A voltage of 10 kV was used to accelerate positive ions toward the sputter target. Portable X-ray Fluorescence was used to confirm the deposited thickness across the length of the pipe. With pulling speed of 2.5 and 5 mm/min, and an acceleration voltage of 5 kV, a thickness of 39±25 and 4±3 nm was deposited.

These were measured in the same manner as above. Further optimisation of the process would be expected to yield better deposition rate and uniformity of the deposited film.

The foregoing description of the invention includes preferred forms thereof. Modifications may be made thereto without departing from the scope of the invention, as defined by the accompanying claims.

The invention claimed is:

1. Ion beam sputtering apparatus comprising:
    an ion source configured to generate a hollow ion beam along a beam axis that is located in a hollow part of the hollow ion beam; and
    a sputtering target having a target body that defines at least one target surface, the target body comprising sputterable particles, the target body being located relative to the ion source so that the hollow ion beam hits the at least one target surface to sputter particles from the target body towards a surface of an object to be modified;
    wherein the target body is shaped so that the particles sputtered towards the surface of the object to be modified are sputtered from the sputtering target in radially extending sputter directions relative to the beam axis, the sputter directions extending towards the beam axis;
    wherein the target body has a target passage that is hollow and extends through the target body, the target passage having an ion beam inlet for the hollow ion beam and a particle outlet for sputtered particles to exit the target passage towards the surface of the object to be modified;
    wherein a cross sectional area of the particle outlet, in a plane perpendicular to the beam axis, is substantially smaller than a cross sectional area of a hollow portion of the hollow ion beam such that the target passage is shaped to prevent the hollow ion beam exiting the target passage towards the surface of the object to be modified without hitting the target surface.

2. The apparatus of claim 1, wherein the at least one target surface is in the form of at least one surface of the target body that at least partly defines the passage.

3. The apparatus of claim 2, wherein a cross sectional area of the ion beam inlet, in a plane perpendicular to the beam axis, is substantially larger than a cross sectional area circumscribed by an external periphery of the ion beam so that the beam can pass through the inlet.

4. The apparatus of claim 1, wherein at least part of the target passage intermediate the ion beam inlet and the particle outlet tapers towards the particle outlet.

5. The apparatus of claim 4, wherein the target passage tapers from at the ion beam inlet to at the particle outlet.

6. The apparatus of claim 5, wherein the passage tapers at a substantially constant rate.

7. The apparatus of claim 1, wherein the beam axis intersects the ion beam inlet, the target passage and the particle outlet.

8. The apparatus of claim 7, wherein the beam axis is a central beam axis, and the target passage has a central passage axis that is substantially coaxial with the beam axis.

9. The apparatus of claim 8, wherein the target passage is symmetrical about the central passage axis and/or the beam axis.

10. The apparatus of claim 9, wherein the target body is also symmetrical about the central passage axis and/or the beam axis.

11. The apparatus of claim 10, wherein the ion beam inlet and the particle outlet are substantially centred on the passage axis and/or the beam axis.

12. The apparatus of claim 1, wherein a cross sectional shape of the ion beam inlet, in a plane perpendicular to the beam axis, is selected from a group comprising substantially circular, oval, and rectangular having rounded corners.

13. The apparatus of claim 1, wherein a cross sectional shape of the particle outlet, in a plane perpendicular to the beam axis, is selected from a group comprising substantially circular, oval, and rectangular having rounded corners.

14. The apparatus of claim 1, further comprising a stencil at the particle outlet that defines a pattern for depositing the sputtered particles on to the surface of the object to be modified according to the pattern.

15. The apparatus of claim 14, wherein the stencil is located adjacent, and at least partly extends across, the particle outlet.

16. The apparatus of claim 1, wherein the sputtering target comprises one or more vacuum vents or openings that each extend through the target body.

17. The apparatus of claim 16, wherein each of the one or more vacuum vents extends through the target body from a first end or part of the target body at the ion beam inlet to a second end or part of the target body at the particle outlet.

18. The apparatus of claim 1, the apparatus comprising or associated with a support for at least partly supporting the object having the surface to be modified adjacent the particle outlet of the sputtering target, outside the passage.

19. The apparatus of claim 1, wherein the ion source and the sputtering target are moveable relative to the object having the surface to be modified, that is located adjacent the particle outlet, outside the passage, in a direction that is substantially perpendicular to the beam axis.

20. The apparatus of claim 1, wherein the hollow ion beam has a width W and an inner radius R at the ion source and exhibits an increase in beam width as the hollow ion beam travels toward the sputtering target, the increase in beam width comprising:
    an increase of the beam width of A away from the beam axis; and
    an increase of the beam width of B toward the beam axis.

21. The apparatus of claim 20, wherein the sputtering target has a height d defined by $d=(A+W+B)\tan \delta$, wherein $\delta$ represents an angle of a slope of the sputtering target.

22. The apparatus of claim 21, wherein the sputtering target has a maximum inner radius r equal to an inner radius R−B of the hollow ion beam as it hits the sputtering target, the maximum inner radius defined by $a \leq r \leq R-B$, wherein a is a minimum radius of a deposition area.

23. The apparatus of claim 20, wherein the sputtering target has a height h defined by $h \geq d$, wherein d is defined by $d=(A+W+B)\tan \delta$, and wherein $\delta$ represents an angle of a slope of the sputtering target.

24. The apparatus of claim 20, wherein the sputtering target has a minimum width w defined by $w \geq A+W+B$.

25. The apparatus of claim 1, wherein the sputtering target comprises a single material so that the at least one target surface provides the sputterable particles.

26. The apparatus of claim 1, wherein the sputtering target comprises at least a first material and a second material, the first material different to the second material.

27. The apparatus of claim 26, wherein the first material and the second material are positioned at substantially the same angle of incidence with respect to the hollow ion beam.

28. The apparatus of claim 26, wherein the first material is positioned at a first angle of incidence with respect to the hollow ion beam and the second material is positioned at a second angle of incidence with respect to the hollow ion beam, the first angle of incidence different to the second angle of incidence.

29. The apparatus of claim 1, wherein the object having the surface to be modified is moveable relative to the ion source and the sputtering target.

30. The apparatus of claim 29, wherein the object having the surface to be modified is moveable from atmospheric pressure into a vacuum chamber within which exists at least a partial vacuum, the vacuum chamber at least partly defined by a housing.

31. A method of sputtering particles onto a surface comprising:
   locating the surface adjacent the particle outlet of the sputtering apparatus of claim 1, outside the target passage;
   creating at least a partial vacuum within a vacuum chamber that is at least partly defined by a housing that is associated with and/or part of the sputtering apparatus;
   generating a hollow ion beam with the ion source of the sputtering apparatus; and
   directing the hollow ion beam into the target passage via the ion beam inlet to sputter particles onto the surface.

32. The method of claim 31, further comprising sliding the surface under or in front of the sputtering apparatus.

33. The method of claim 32, further comprising sliding the surface from atmospheric pressure into the vacuum chamber.

34. A method of sputtering particles onto an outer surface of an arcuate surface, the method comprising:
   locating the arcuate surface within a sputtering chamber of the sputtering apparatus of claim 6 so that the arcuate surface at least partly extends across the sputtering chamber;
   creating at least a partial vacuum within a vacuum chamber that is at least partly defined by a housing that is associated with and/or part of the sputtering apparatus;
   generating a hollow ion beam with the ion source; and
   directing the hollow ion beam into the sputtering chamber via the ion beam inlet to sputter particles onto the arcuate surface.

35. A method of sputtering particles onto a surface to be modified, the method comprising:
   locating a sputtering target adjacent a particle outlet of a sputtering apparatus, the sputtering target having a target body defining at least one target surface;
   creating at least a partial vacuum within a vacuum chamber that is at least partly defined by a housing that is associated with and/or part of the sputtering apparatus;
   generating a hollow ion beam along a beam axis that is located in a hollow part of the hollow ion beam with an ion source of the sputtering apparatus; and
   directing the hollow ion beam into a target passage via an ion beam inlet so that the hollow ion beam hits the at least one target surface to sputter particles onto the surface to be modified;
   wherein the target body is shaped so that the particles sputtered towards the surface to be modified are sputtered from the sputtering target in radially extending sputter directions relative to the beam axis, the sputter directions extending towards the beam axis;
   wherein a cross sectional area of the particle outlet, in a plane perpendicular to the beam axis, is substantially smaller than a cross sectional area of a hollow portion of the ion beam; and
   wherein the ion beam is prevented from exiting the target passage through the particle outlet towards the surface to be modified.

36. The method of claim 35, wherein the sputtering target comprises a single material so that the at least one target surface provides the sputterable particles.

37. The method of claim 35, wherein the sputtering target comprises at least a first material and a second material, the first material different to the second material.

38. The method of claim 35, further comprising locating a stencil at the particle outlet that defines a pattern for depositing the sputtered particles onto the surface to be modified according to the pattern.

39. The method of claim 35, further comprising sliding the surface to be modified under or in front of the ion source and the sputtering target.

40. The method of claim 39, further comprising sliding the surface to be modified from atmospheric pressure into the vacuum chamber.

* * * * *